United States Patent
Willer et al.

(10) Patent No.: US 8,258,564 B2
(45) Date of Patent: Sep. 4, 2012

(54) INTEGRATED CIRCUIT WITH FLOATING-GATE ELECTRODES INCLUDING A TRANSITION METAL AND CORRESPONDING MANUFACTURING METHOD

(75) Inventors: Josef Willer, Riemerling (DE); Franz Hofmann, München (DE); Michael Specht, München (DE); Christoph Friederich, München (DE); Doris Keitel-Schulz, Höhenkirchen (DE); Lars Bach, Ullersdorf (DE); Thomas Melde, Dresden (DE)

(73) Assignee: Qimonda AG, Munich (DE)

( * ) Notice: Subject to any disclaimer, the term of this patent is extended or adjusted under 35 U.S.C. 154(b) by 926 days.

(21) Appl. No.: 12/104,750

(22) Filed: Apr. 17, 2008

(65) Prior Publication Data

US 2009/0261397 A1    Oct. 22, 2009

(51) Int. Cl.
    *H01L 29/788*    (2006.01)

(52) U.S. Cl. .................................. 257/315; 257/314
(58) Field of Classification Search ............ 257/314, 257/315

See application file for complete search history.

(56) References Cited

U.S. PATENT DOCUMENTS

| | | | |
|---|---|---|---|
| 5,923,976 A * | 7/1999 | Kim | 438/261 |
| 7,615,445 B2 * | 11/2009 | Chien et al. | 438/257 |
| 7,635,628 B2 * | 12/2009 | Khang et al. | 438/264 |
| 7,719,065 B2 * | 5/2010 | Ahn et al. | 257/411 |

* cited by examiner

*Primary Examiner* — Douglas Menz
(74) *Attorney, Agent, or Firm* — Murphy, Bilak & Homiller, PLLC

(57) ABSTRACT

An integrated circuit is described. The integrated circuit may comprise a multitude of floating-gate electrodes, wherein at least one of the floating-gate electrodes has a lower width and an upper width, the lower width being larger than the upper width, and wherein the at least one of the floating-gate electrodes comprises a transition metal. A corresponding manufacturing method for an integrated circuit is also described.

15 Claims, 33 Drawing Sheets

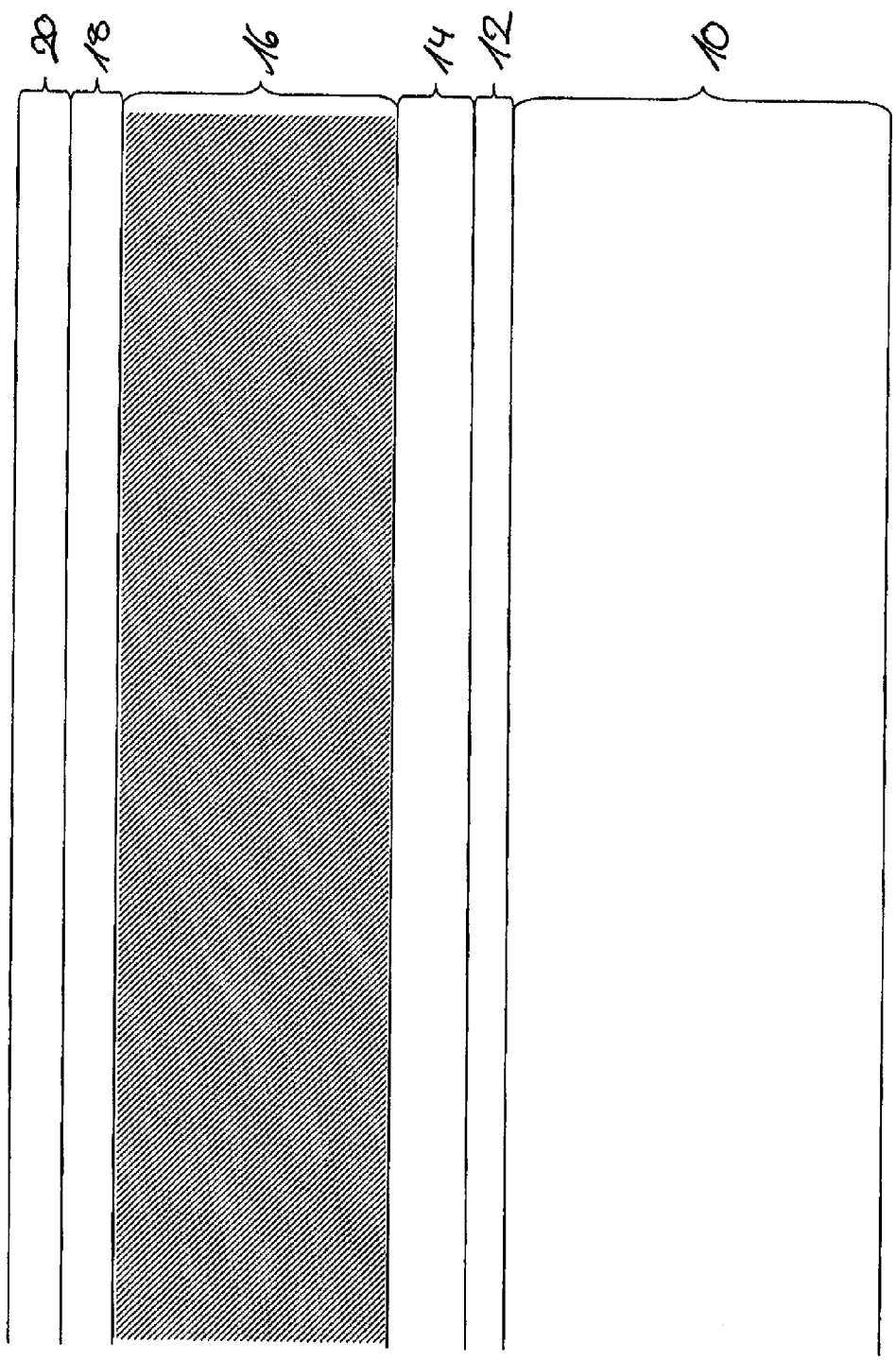

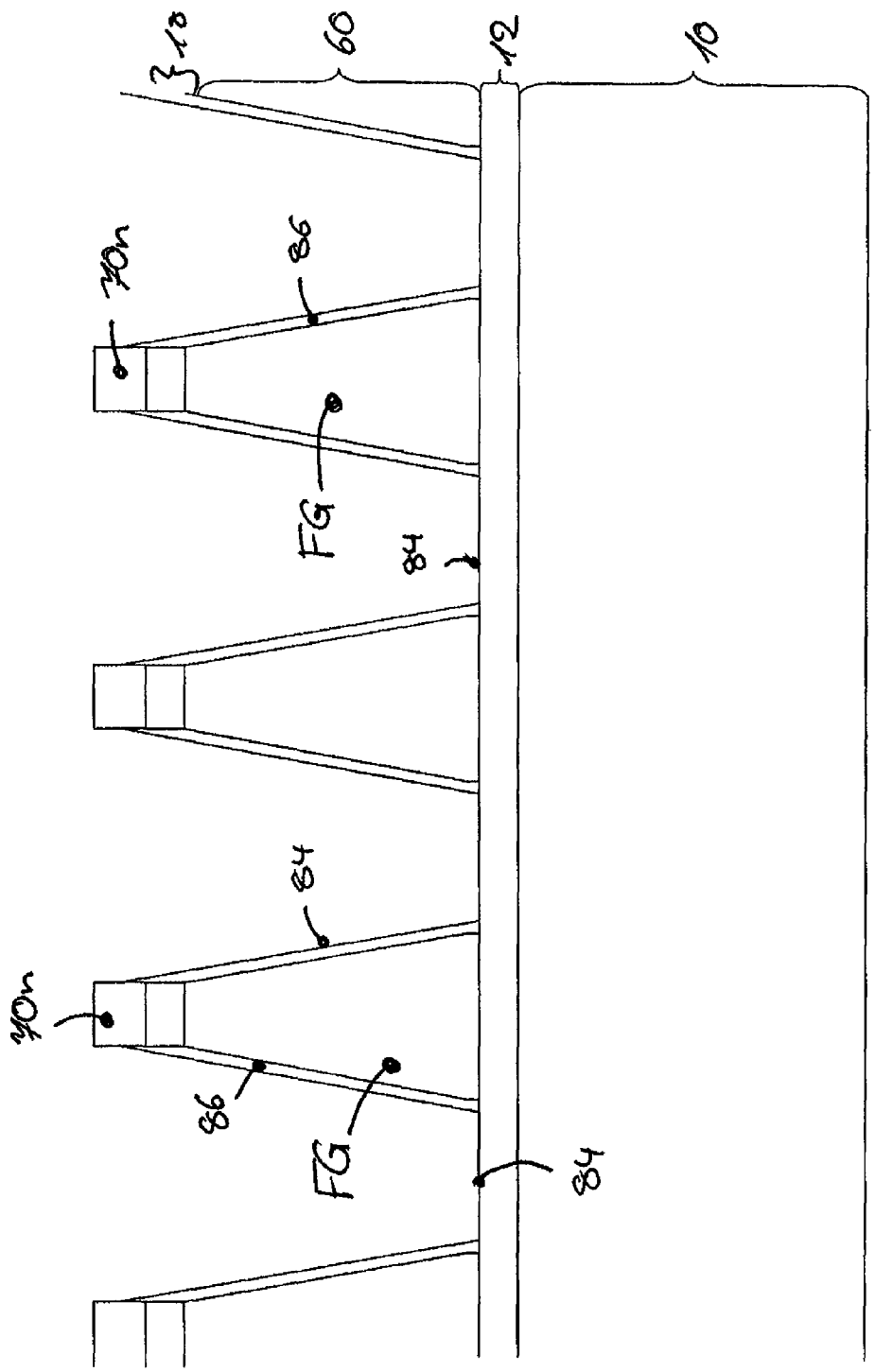

US 8,258,564 B2

INTEGRATED CIRCUIT WITH FLOATING-GATE ELECTRODES INCLUDING A TRANSITION METAL AND CORRESPONDING MANUFACTURING METHOD

BACKGROUND

1. Field of Invention

The invention generally relates to an integrated circuit. Furthermore, the invention also relates to a corresponding manufacturing method for an integrated circuit.

2. Related Art

Floating gate transistors are commonly used for non-volatile storage such as NAND flash devices and NOR flash devices to store the charge of one or more bits per floating gate transistor in the associated floating gate. The floating gate is mounted above an active area of substrate silicon which forms the transistor channel and is separated from the substrate by a tunnel dielectric.

There is a need to provide flash memories with a high density of floating gate transistors at relative low costs and with a reasonable good functionality of the floating gate transistors.

SUMMARY

An integrated circuit is described. The integrated circuit may include a multitude of floating-gate electrodes, wherein at least one of the floating-gate electrodes has a lower width and an upper width, the lower width being larger than the upper width, and wherein the at least one of the floating-gate electrodes comprises a transition metal.

Furthermore, a manufacturing method for an integrated circuit is described. The manufacturing method may include: depositing an insulation layer on a semiconductor substrate; depositing at least one layer of floating-gate electrode material on the insulation layer, the at least one layer of floating-gate electrode material comprising a transition metal; forming a multitude of floating-gate electrodes of the at least one layer of floating-gate electrode material, wherein at least one the floating-gate electrodes has a lower width and an upper width, the lower width being larger than the upper width.

Other systems, methods, features and advantages of the invention will be or will become apparent to one with skills in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The invention can be better understood by referring to the following figures. The components in the figures are not necessarily to scale, emphasis instead being placed upon illustrating the principles of the invention. In the figures, like reference numerals designate corresponding parts throughout the different views.

In the figures:

FIGS. 1A-1E show cross sections of a semiconductor structure for illustrating a manufacturing method for an integrated circuit;

FIGS. 7A-7F show cross sections of another semiconductor structure for illustrating another approach of the manufacturing method;

FIGS. 8A-8F show cross sections of another semiconductor structure for illustrating another approach of the manufacturing method.

DETAILED DESCRIPTION

Figure 1B:
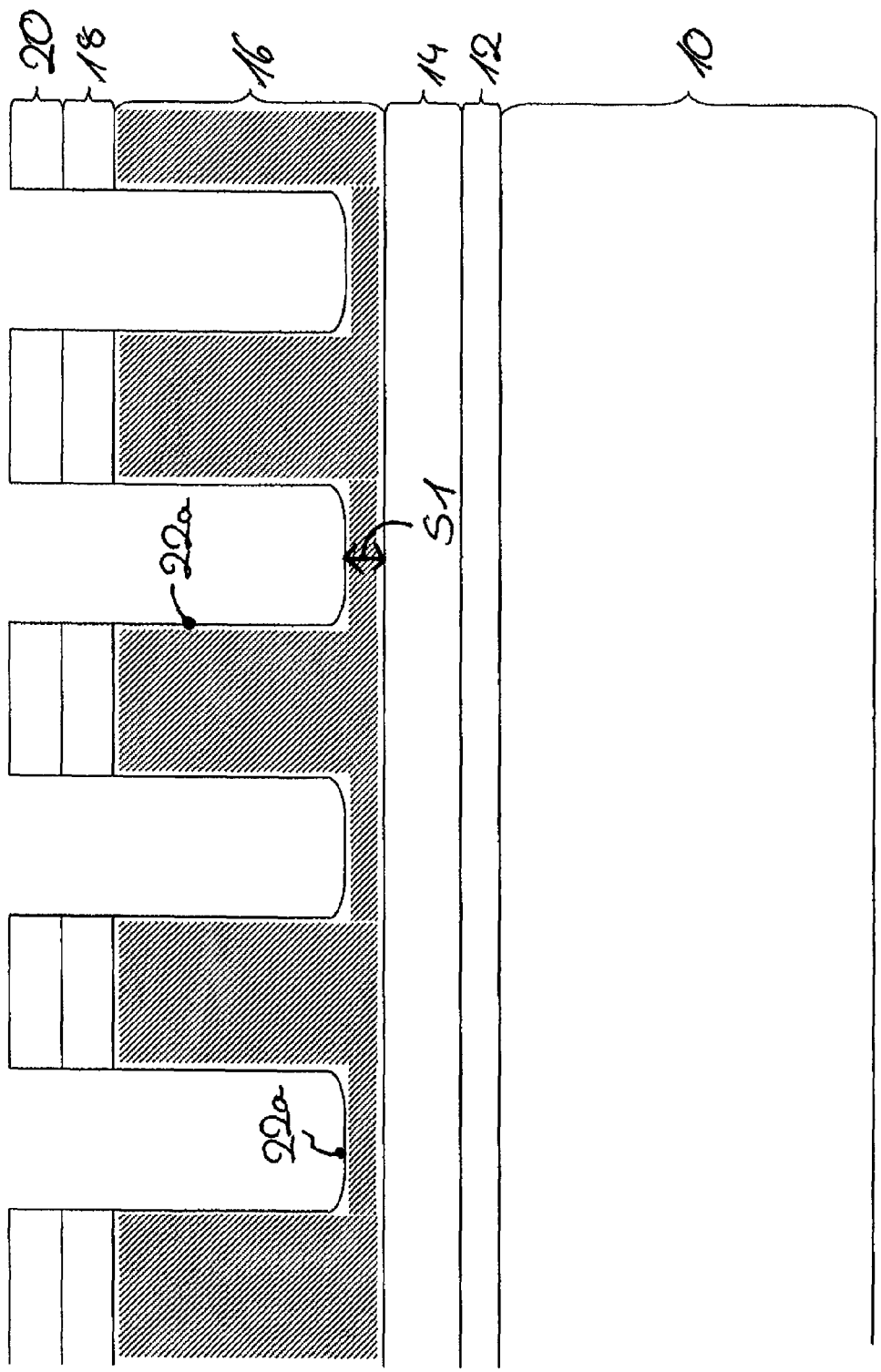

In the following description, reference is made to the accompanying drawings that form a part hereof, and in which is shown by way of illustration one or more specific implementations in which the technology may be practiced. It is to be understood that other implementations may be utilized and structural changes may be made without departing form the scope of this technology.

FIGS. 1A-1E show cross sections of a semiconductor structure for illustrating a manufacturing method for an integrated circuit.

First, a method of producing a multilayer semiconductor structure (PMSS-method) is carried out. In a first process step of the PMSS-method, an insulation layer 12, for example a silicon oxide layer is formed on a surface of a semiconductor substrate 10. In case that the semiconductor substrate 10 includes silicon, the silicon oxide layer may be formed for instance during a thermal oxidation step. However, the present technology is not restricted to silicon oxide to provide the insulation layer 12. Various other insulating materials may also be deposited on the semiconductor substrate 10 to provide the insulation layer 12. The layer thickness of the insulation layer 12 may be about 10 nm.

A layer of a conductive material 14 is deposited on the insulation layer 12. The layer thickness of the layer of a conductive material 14 may be in a range between 10 nm to 30 nm. The layer of a conductive material 14 may comprise polysilicon, a metal, a transition metal or a transition metal compound. In the present example, the layer of a conductive material 14 includes polysilicon. In a subsequent process step, a transition metal layer 16 is deposited on the layer of a conductive material 14. The transition metal layer 16 may include iridium, ruthenium, a transition metal oxide, a transition metal silicide, a transition metal boride, a transition metal aluminide, a transition metal carbide and/or a transition metal nitride. For instance, the transition metal layer 16 may include iridium oxide, ruthenium oxide, tungsten silicide, molybdenum silicide, tantalum silicide, titanium silicide, cobalt silicide, zirconium silicide, hafnium silicide, niobium silicide, tungsten nitride, titanium nitride, tantalum nitride, hafnium nitride and/or zirconium nitride. Of course, the transition metal layer 16 may include at least two of the materials listed above. The transition metal layer 16 may have a layer thickness between 20 nm to 100 nm. The transition metal of transition metal layer 16 may have a different etch rate than the material of the layer of a conductive material 14.

The layer of a conductive material 14 and/or transition metal layer 16 are formed for instance by a chemical vapour deposition (CVD) or by a physical vapour deposition (PVD). The materials of the layers 14 and 16 may react with each other. Thus, the interface between the layers 14 and 16 may not be flat. Instead, the interface between the layers 14 and 16 may have peaks and/or trenches. However, the present technology in not restricted to a non-flat interface between the layers 14 and 16.

An oxide layer 18 and a nitride layer 20 are formed on the transition metal layer 16. The semiconductor structure produced by the PMSS-method is shown in FIG. 1A.

FIG. 1B shows the result of a method of etching trenches (ET-method) into the semiconductor structure of FIG. 1A. The ET-method starts with the process step of depositing a (not shown) first mask on the surface of the semiconductor structure. The first mask is for instance a carbon hard mask. The mask is structured to expose those areas of nitride layer 20 that cover the sites of (later etched) trenches 22a. This may be done for example by a lithographic step. Then, a reactive ion etch (RIE) step is carried out to etch trenches 22a into the semiconductor structure. The RIE step is stopped when the bottoms of the trenches 22a are within a distance s1 from the interface of the layers 14 and 16. The distance s1 may be in a range between 5 nm to 20 nm. Then the ET-method ends.

Figure 1C:
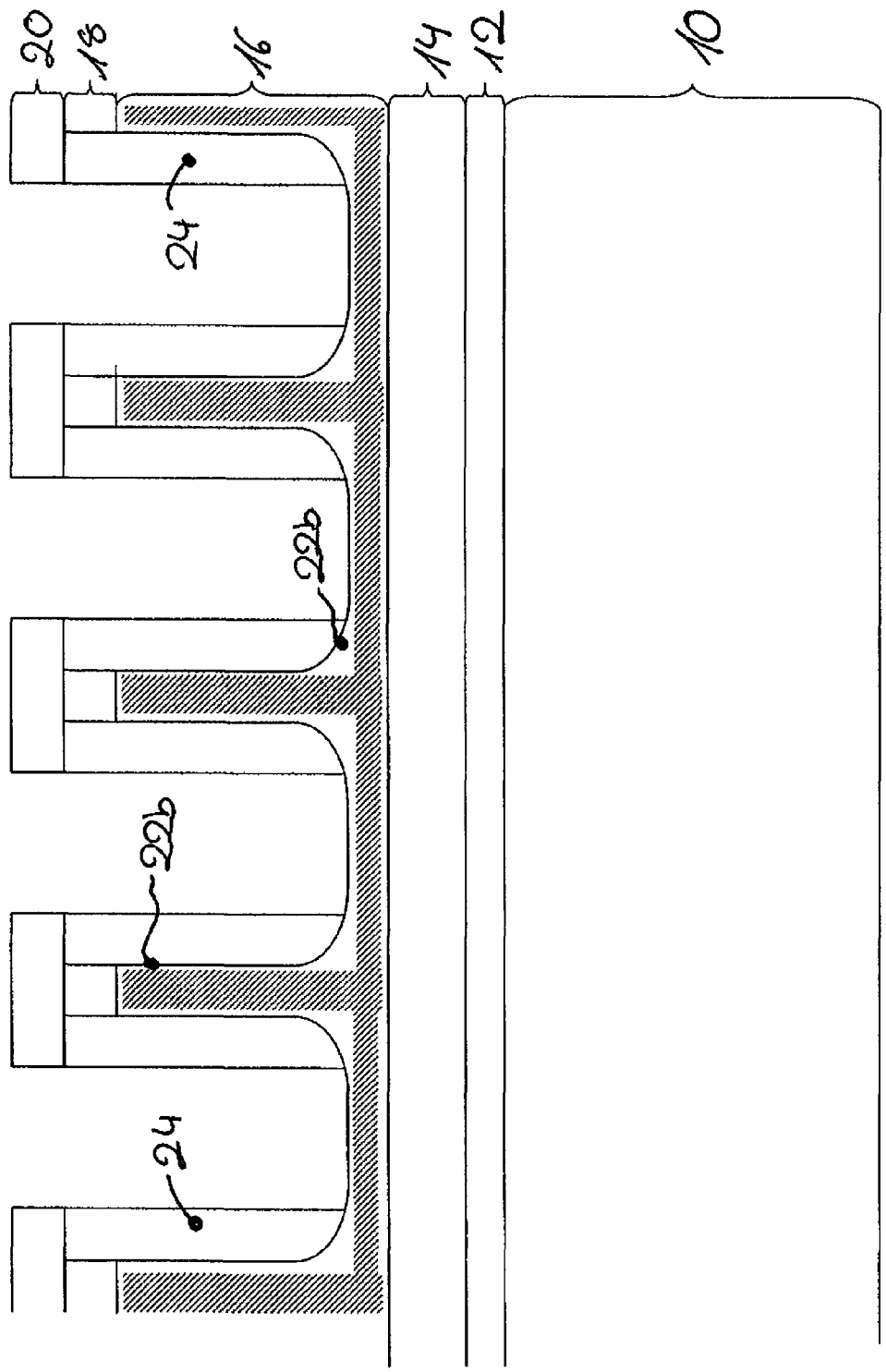

An isotropic etch step is carried out to increase the width of the trenches 22a. This isotropic etch step is performed with an etching material that etches the exposed material of the transition metal layer 16 and the oxide layer 18. However, the nitride of layer 20 is not sensitive against the etching material. To protect the nitride layer 20 further, the first mask is kept on the nitride layer 20 during the isotropic etch step. After the isotropic etch step, the first mask may be removed. The newly formed trenches 22b are shown in FIG. 1C.

A method of forming nitride spacers (FNS-method) to cover the sidewalls of the trenches 22b is carried out. First, the trenches 22b are filled with nitride. Then, a second (not shown) mask is deposited on the nitride layer 20 and structured. In a subsequent process step, an anisotropic etch step is performed to remove the nitride partially from the trenches 22b. This anisotropic etch step is continued till the bottoms of the trenches 22b are exposed. However, due to the anisotropy of this etch step, the nitride covering the sidewalls of the trenches 22b is not attacked more than tolerable. Thus, the nitride spacers 24 shown in FIG. 1C are formed.

A second RIE step is carried out to increase the depth of the trenches 22b. The nitride spacers 24 covering the sidewalls of the trenches 22b are not sensitive against this second RIE step. Therefore, the sidewalls of the trenches 22b, which are protected by the nitride spacers 24, are not damaged by this second RIE step. The second mask is removed after the second RIE step.

Figure 1D:
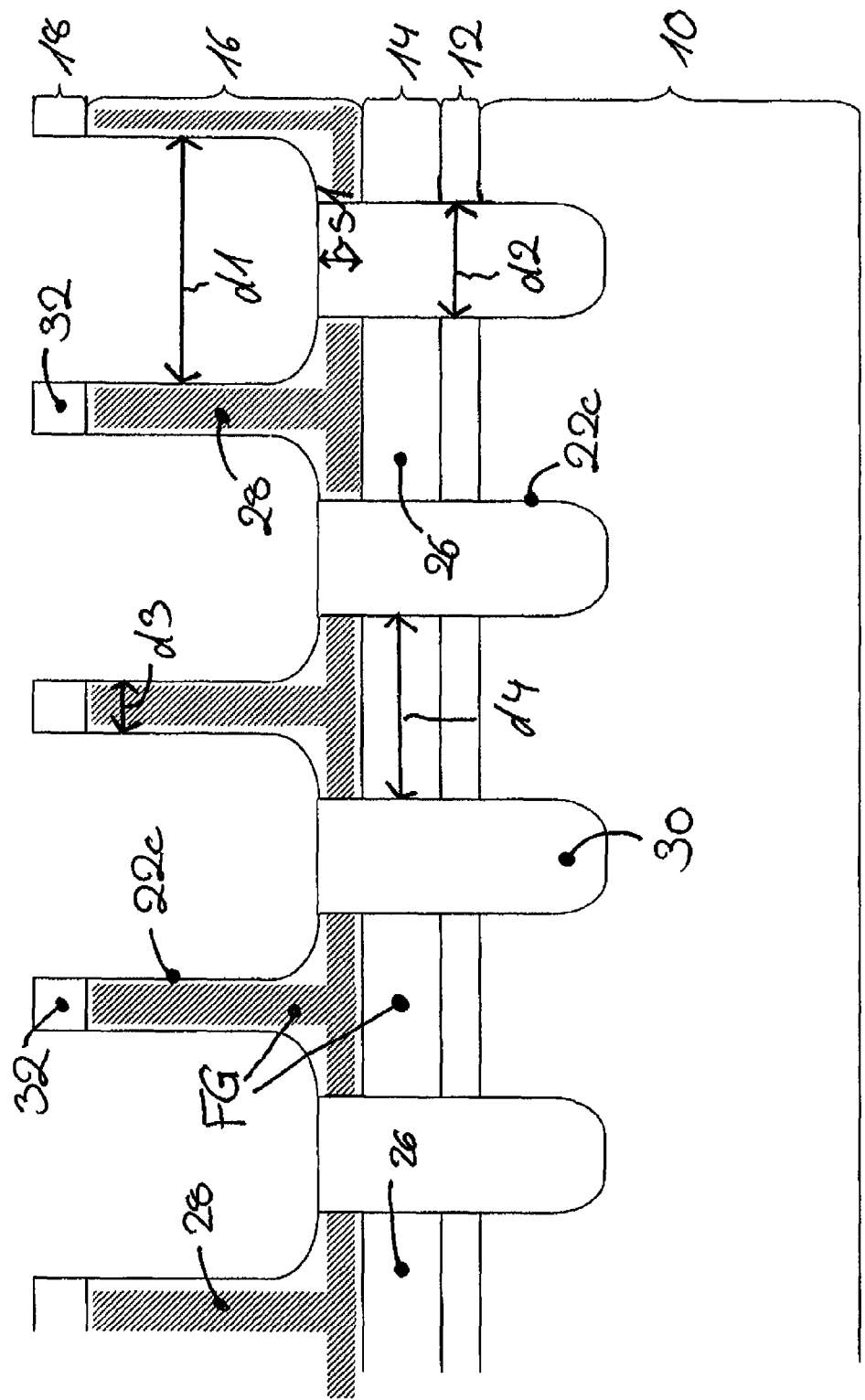

The result of this second RIE step are trenches 22c, which extend from the surface of the semiconductor structure into the semiconductor substrate 10, as can be seen from FIG. 1D. The depths of the trenches 22c is in a range between 100 nm to 300 nm. The trenches 22c have a lower width d2 which is significantly smaller than the upper width d1. For instance, the lower width d2 is in a range between 50 nm to 100 nm while the upper width d1 is in a range between 100 nm to 200 nm.

In the interspaces of the trenches 22c newly formed floating-gate electrodes FG are arranged. Each of these floating-gate electrodes FG includes a lower part 26 formed of the layer of a conductive material 14 and an upper part 28 formed of the transition metal layer 16. The lower part 26 has a column-like shape. The upper part 28 has an inverse T-shape, because its width decreases in the direction to the oxide layer 18. Upper width d3 of the upper part 28 may be in a range between 10 m to 30 nm. Lower width d4 of the upper part 28, which is also the width of the lower part 26, may be in a range between 50 nm to 100 nm.

A floating-gate electrode FG with an inverse-T shape or a triangular shape may provide a reduced interaction, i.e. electrical coupling, between the floating-gate electrode FG and an adjacent floating-gate electrode FG associated with another wordline WL. The interaction between the floating-gate electrode FG and its associated control-gate electrode CG may not be limited due to the inverse-T shape of the floating-gate electrode FG.

Due to the small value of the upper width d3, the upper part 28 of each of the floating-gate electrodes FG includes a transition metal. The low resistivity of the transition metal decreases the risk of depletion. However, to provide a conventional dielectric interface structure, the lower part 26 of each of the floating-gate electrodes FG includes polysilicon.

The trenches 22c are filled with a STI-fill 30 according to the following STI-method. First, the STI-fill-material is deposited on the semiconductor structure. Then, a chemical mechanical polishing (CMP) step is carried out to remove those parts of the STI-fill-material that protrude above the nitride spacers 24. Further, the STI-fill 30 is etched back to a level that is within the distance s1 from the interface of the lower part 26 and the upper part 28.

In a wet chemical etch step, for instance with hot phosphoric acid, the nitride layer 20 and the nitride spacers 24 are completely removed. However, the oxide layer 18 is not sensitive against hot phosphoric acid. Thus, oxide spacers 32 are left on the floating-gate electrodes FG, as can be seen from FIG. 1D.

A method of forming control-gate CG electrodes and wordlines WL (FCW-method) on the semiconductor structure of FIG. 1D is performed.

Figure 1E:
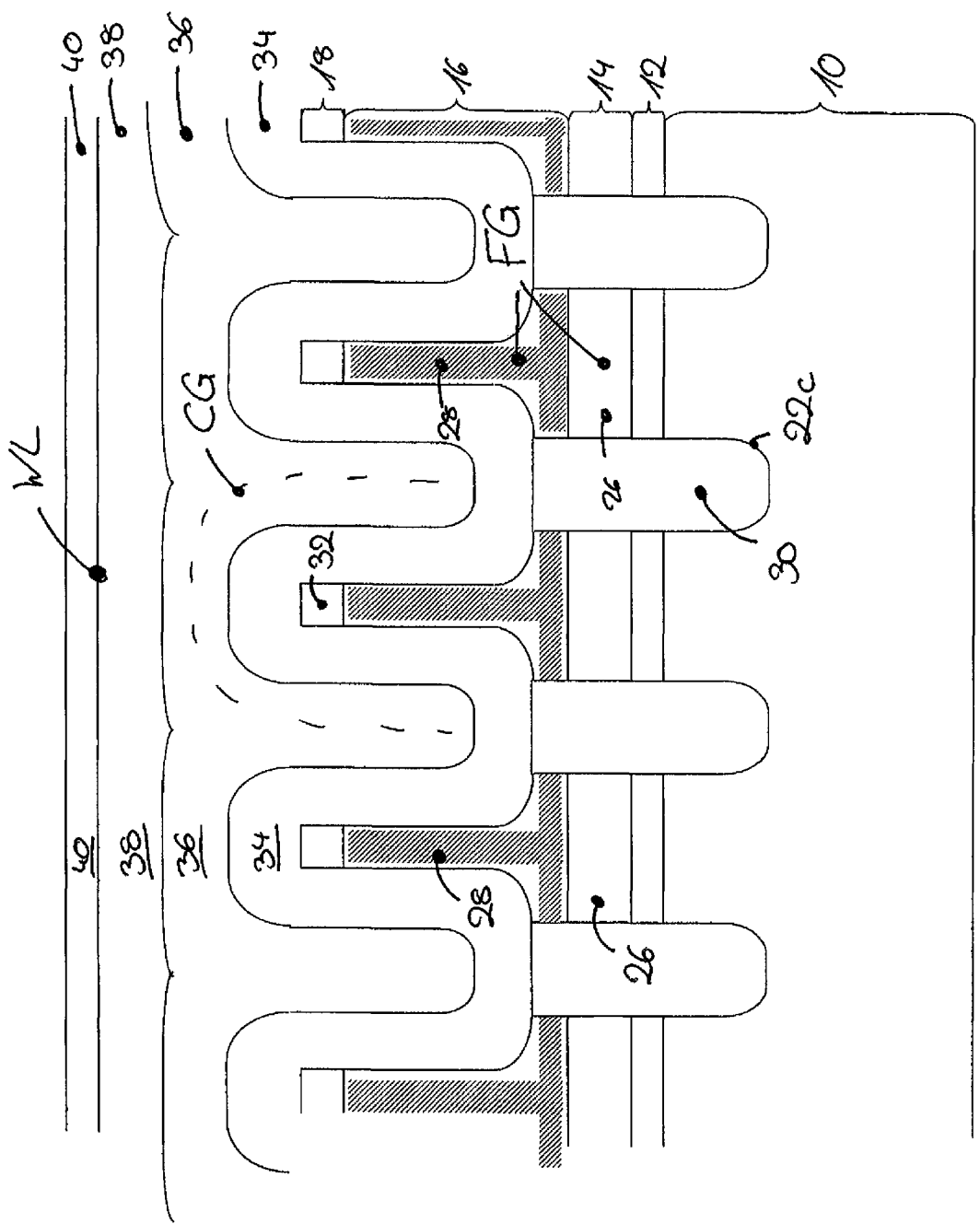

A layer of coupling dielectric material 34, for instance an oxide, is deposited on the surface of the semiconductor structure. Then, a layer of control-gate material 36, for example polysilicon, is deposited on the layer of coupling dielectric material 34 to form control-gate electrodes CG. In an additional step of the FCW-method, the material of the wordlines WL is deposited on the layer of control gate material 36. In the example of FIG. 1E, the wordlines WL include a tungsten nitride layer 38 and a tungsten layer 40.

To provide an additional insulation between the floating-gate electrodes FG and the layer of control-gate material 36, the oxide spacers 32 are arranged on the top of the floating-gate electrodes FG. Due to the small upper width d3 of the floating-gate electrodes FG, a relative strong electrical field may occur at the peak-like upper end of each of the floating-gate electrodes FG. To provide an additional insulation on the peak-like upper end of each of the floating-gate electrodes FG is a good way with regard to the strong electrical field.

As an alternative to the floating-gate electrodes FG formed of polysilicon and a metallic material, the floating-gate electrodes FG may be formed only of the transition metal layer 16. In this case, no layer of a conductive material 14 is deposited on the insulation layer 12 and the transition metal layer 16 may have a layer thickness which is in a range between 50 nm to 100 nm. Furthermore, the layer of a conductive material 14 may include TaN and the transition metal layer 16 may include tungsten. Thus, floating-gate electrodes FG are provided that have a lower subunit of TaN and an upper subunit of tungsten.

FIGS. 2A-2D show cross sections of another semiconductor structure for illustrating another approach of the manufacturing method.

Figure 2A:
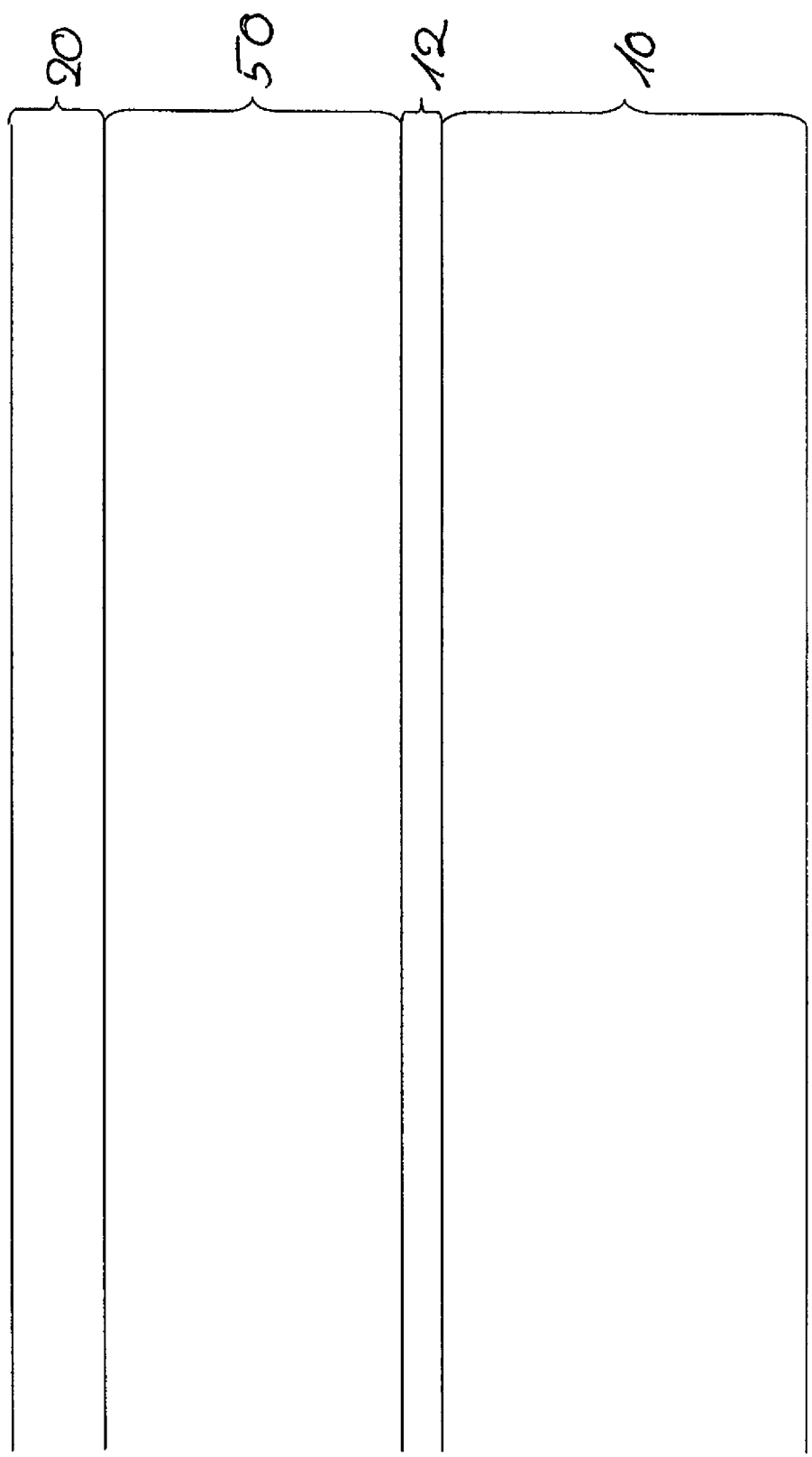
FIGS. 2A-2D show cross sections of another semiconductor structure for illustrating another approach of the manufacturing method.
Figure 2B:
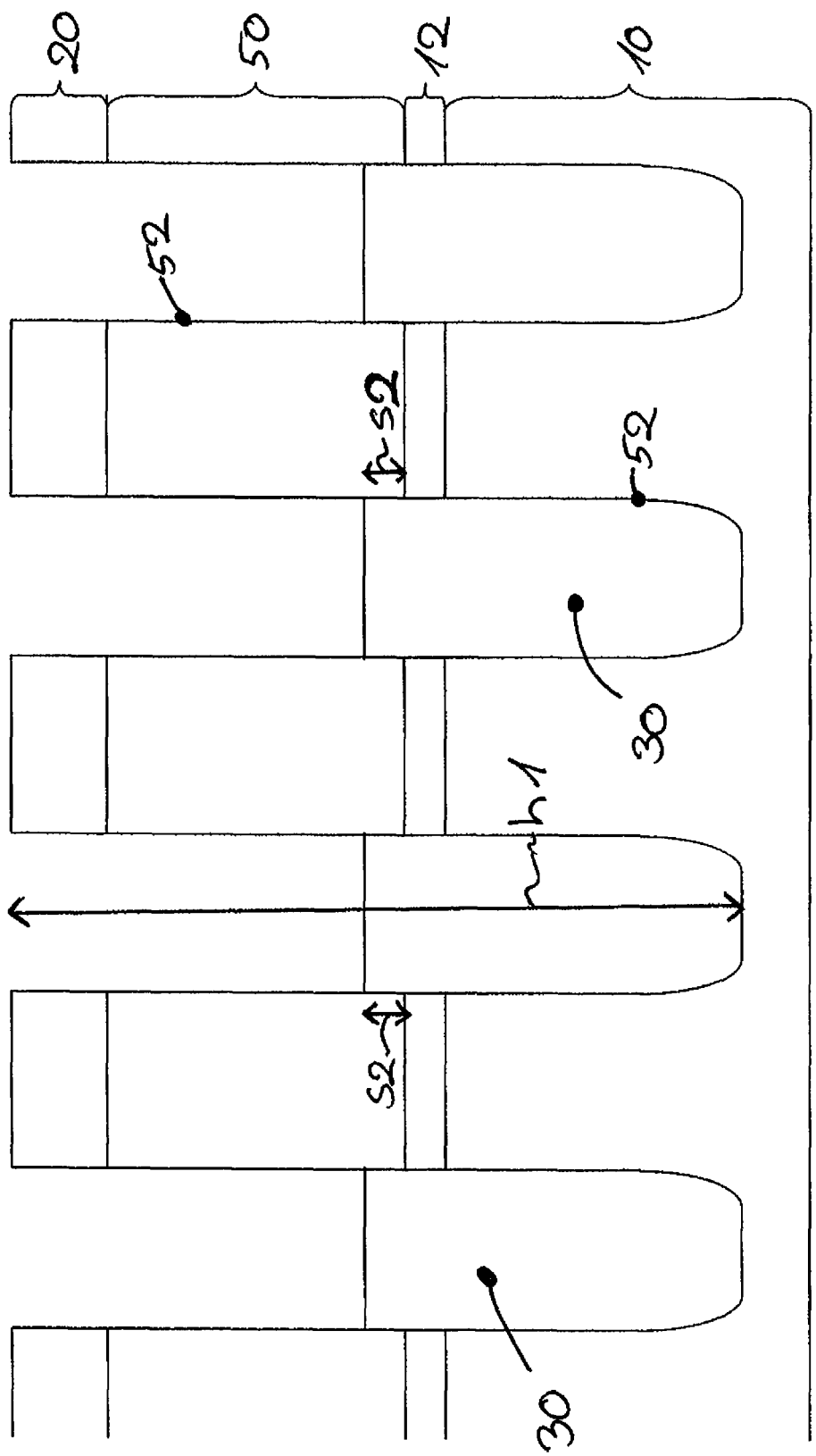

The PMSS-method is carried out to produce the semiconductor structure shown in FIG. 2A. The semiconductor structure has a semiconductor substrate 10, an insulation layer 12, a transition metal layer 50 and a nitride layer 20. The transition metal layer 50 may include at least one of the materials iridium and/or ruthenium. Of course, the transition metal layer 50 may also include a transition metal oxide, a transition metal silicide, a transition metal boride, a transition metal aluminide, a transition metal carbide and/or a transition metal nitride. For example, the transition metal layer 50 may include at least one of the materials: iridium oxide, ruthenium oxide, tungsten silicide, molybdenum silicide, tantalum silicide, titanium silicide, cobalt silicide, zirconium silicide, hafnium silicide, niobium silicide, tungsten nitride, titanium nitride, tantalum nitride, hafnium nitride and/or zirconium nitride. The transition metal layer 50 may have a layer thickness between 50 nm to 100 nm. The variety of the materials suited for the insulation layer 12 is mentioned above.

The ET-method is performed to etch trenches 52 into the semiconductor structure of FIG. 2A. The ET-method is stopped when the newly etched trenches 52 extend from the surface of the semiconductor structure into the semiconductor substrate 10. The total height h1 of the trenches 52 is in a range between 250 to 350 nm.

The trenches 52 are filled with an STI-fill 30 according to the STI-method. The surface of the STI-fill 30 is within a distance s2 from the interface between the insulation layer 12 and the transition metal layer 50, as can be seen from FIG. 2B. The distance s2 may be in a range between 10 nm to 30 nm.

Figure 2C:
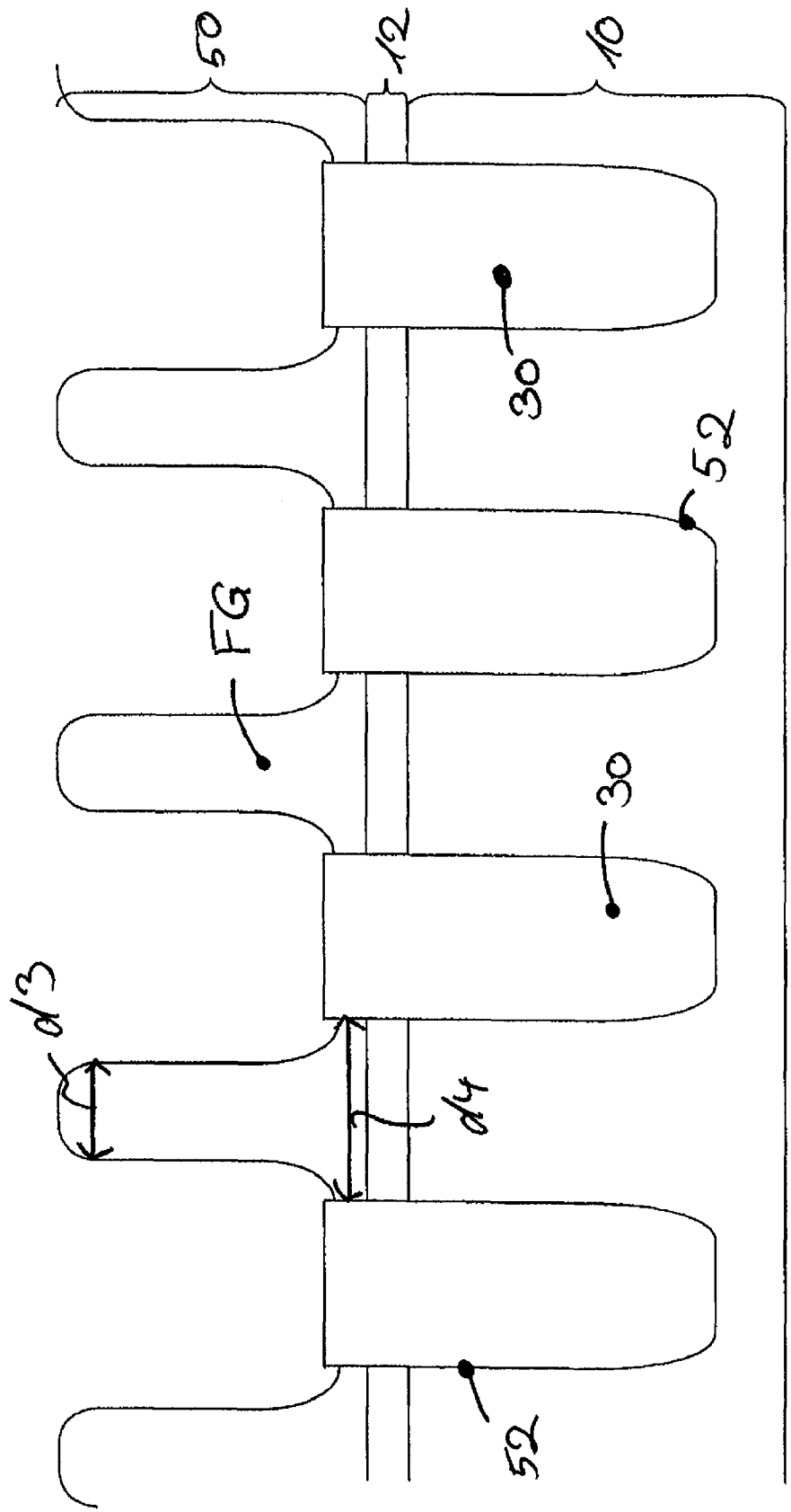

Nitride layer 20 is removed by an etching step with hot phosphoric acid. In a following process step, an isotropic etch step is carried out to form floating-gate electrodes FG of the transition metal layer 50. However, this isotropic etch step is performed with an etching material which does not attack the STI-fill 30. The result of the isotropic etch step is shown in FIG. 2C. The newly formed floating-gate electrodes FG have an inverse-T shape with an upper width d3 between 10 nm to 50 nm and a lower width d4 between 30 nm to 100 nm.

Figure 2D:
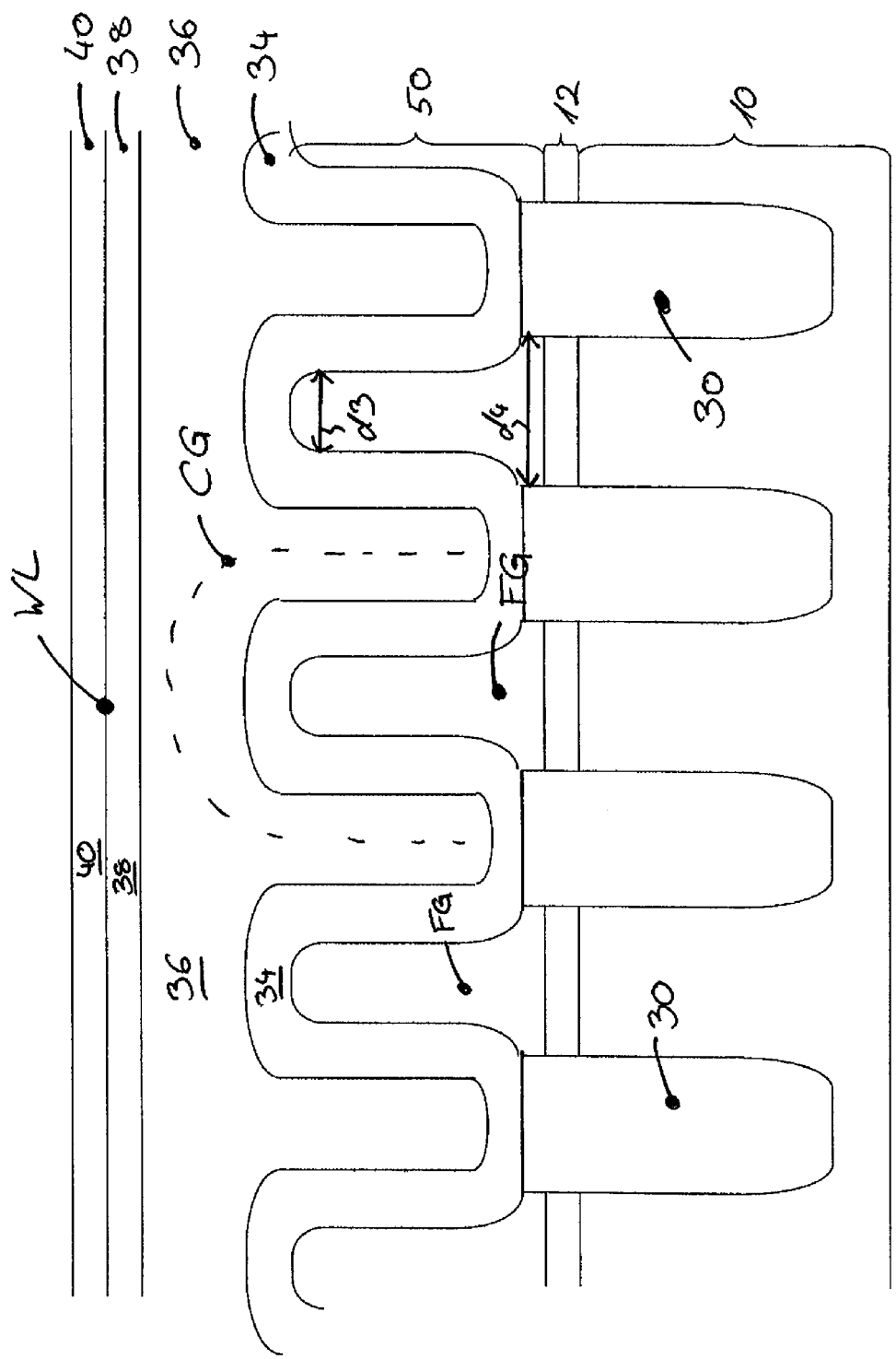

The STI-fill 30 protruding above the interspaces between the floating-gate electrodes FG is etched away. Then, the FCW-method is repeated to form control-gate electrodes CG and wordlines WL. Thus, the semiconductor structure shown in FIG. 2D is produced.

Of course, it is also possible to form floating-gate electrodes FG according to the method mentioned above from two layers of different materials. In this case, the lower layer may be a polysilicon layer and the upper layer may be a transition metal layer.

Figure 3A:
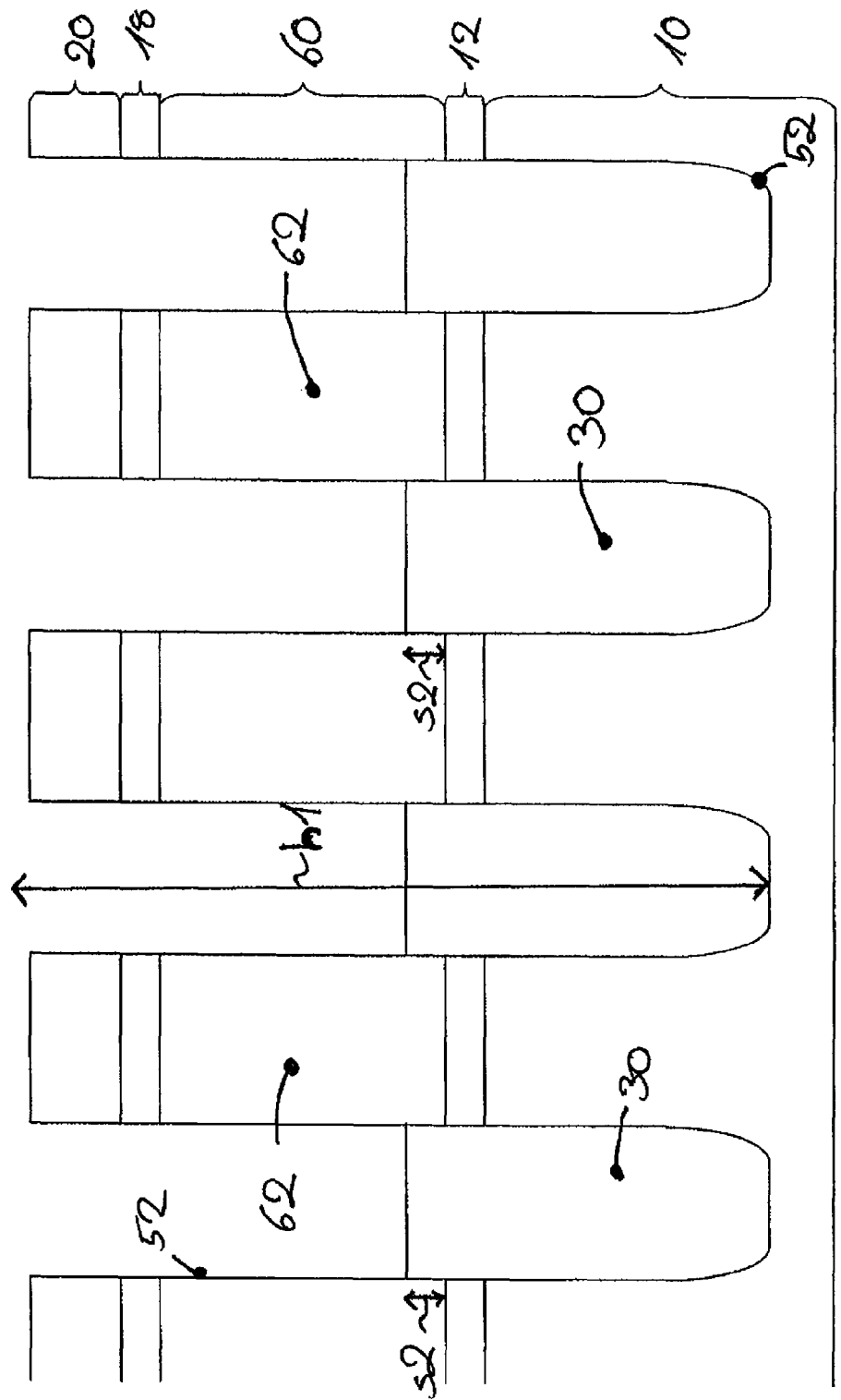
FIGS. 3A, 3Ba, 3Bb and 3C show cross sections of another semiconductor structure for illustrating another approach of the manufacturing method.
Figure 3B:
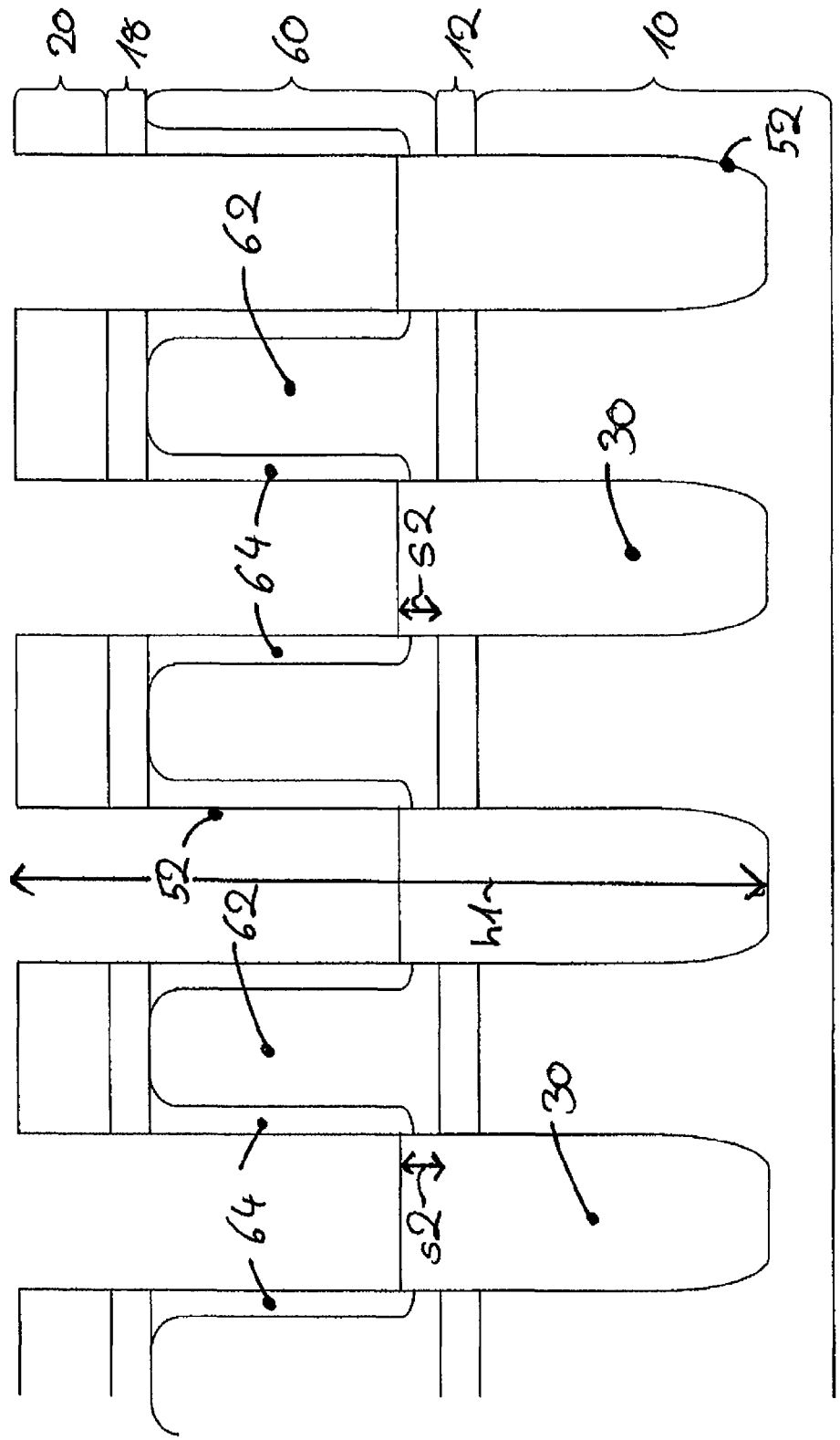
Figure 3B:
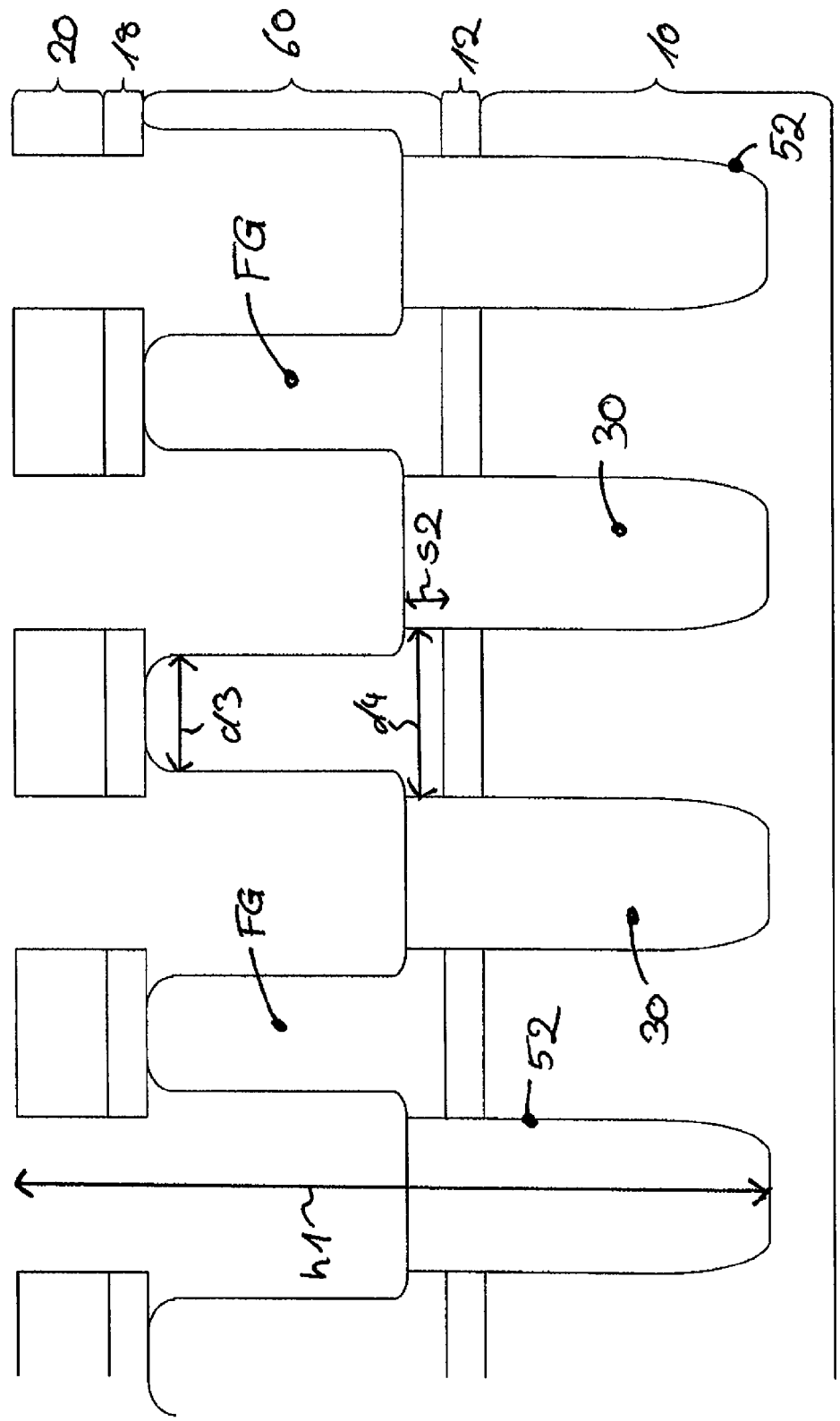

FIGS. 3A, 3Ba, 3Bb and 3C show cross sections of another semiconductor structure for illustrating another approach of the manufacturing method.

The PMSS-method is carried out to form a semiconductor structure comprising a semiconductor substrate 10, an insulation layer 12, a layer of floating-gate electrode material 60, an oxide layer 18 and a nitride layer 20. The layer of floating-gate electrode material 60 may include polysilicon and/or at least one transition metal. For example, the layer of floating-gate electrode material 60 may include iridium, ruthenium, a transition metal oxide, a transition metal silicide and/or a transition metal nitride. Furthermore, the layer of floating-gate electrode material 60 may include a first layer of polysilicon and at least one second layer of a transition metal.

The ET-method is performed to etch trenches 52. The total height h1 of these trenches 52 may be in a range between 250 nm to 350 nm. The trenches 52 are filled with a STI-fill 30 according to the STI-method. The STI-fills 30 have a surface within a distance s2 from the interface of the insulation layer 12 and the layer of floating-gate electrode material 60. The result is shown in FIG. 3A.

In the interspaces of the trenches 52, strings 62 of the material of former layer of floating-gate electrode material 60 are formed. The lower parts of the sidewalls of these strings 62 are covered by the STI-fill 30. However, the upper parts of the sidewalls of the strings 62 are exposed.

In a further process step, the semiconductor structure of FIG. 3A is heated in an oxygen atmosphere to perform a thermal oxidation of the exposed surfaces of the strings 62. Thus, silicon oxide layers 64 are formed that cover the exposed areas of the strings 62 completely. These silicon oxide layers 64 may have a layer thickness up to 30 nm.

However, the lower parts of the sidewalls of the strings 62 are protected by the STI-fill 30 against the oxygen atmosphere. Therefore, the lower parts of the sidewalls are not oxidised (i.e. the oxidation rate is negligibly small) during the thermal oxidation, as can be seen from FIG. 3Ba.

In a subsequent process step, the silicon oxide layers 64 are etched away. Thus, floating-gate electrodes FG are formed that have an upper width d3 that is significantly smaller than the lower width d4. Of course, to decrease the upper width d3 further, it is possible to repeat the thermal oxidation step several times.

As an alternative to the thermal oxidation step of FIG. 3Ba, it is also possible to form floating-gate electrodes FG by a wet etch of the exposed areas of the strings 62. The result is shown in FIG. 3Bb. This wet etch step may be performed in case that the material of the layer of floating-gate electrode material 60 is not suited for the thermal oxidation step.

Figure 3C:
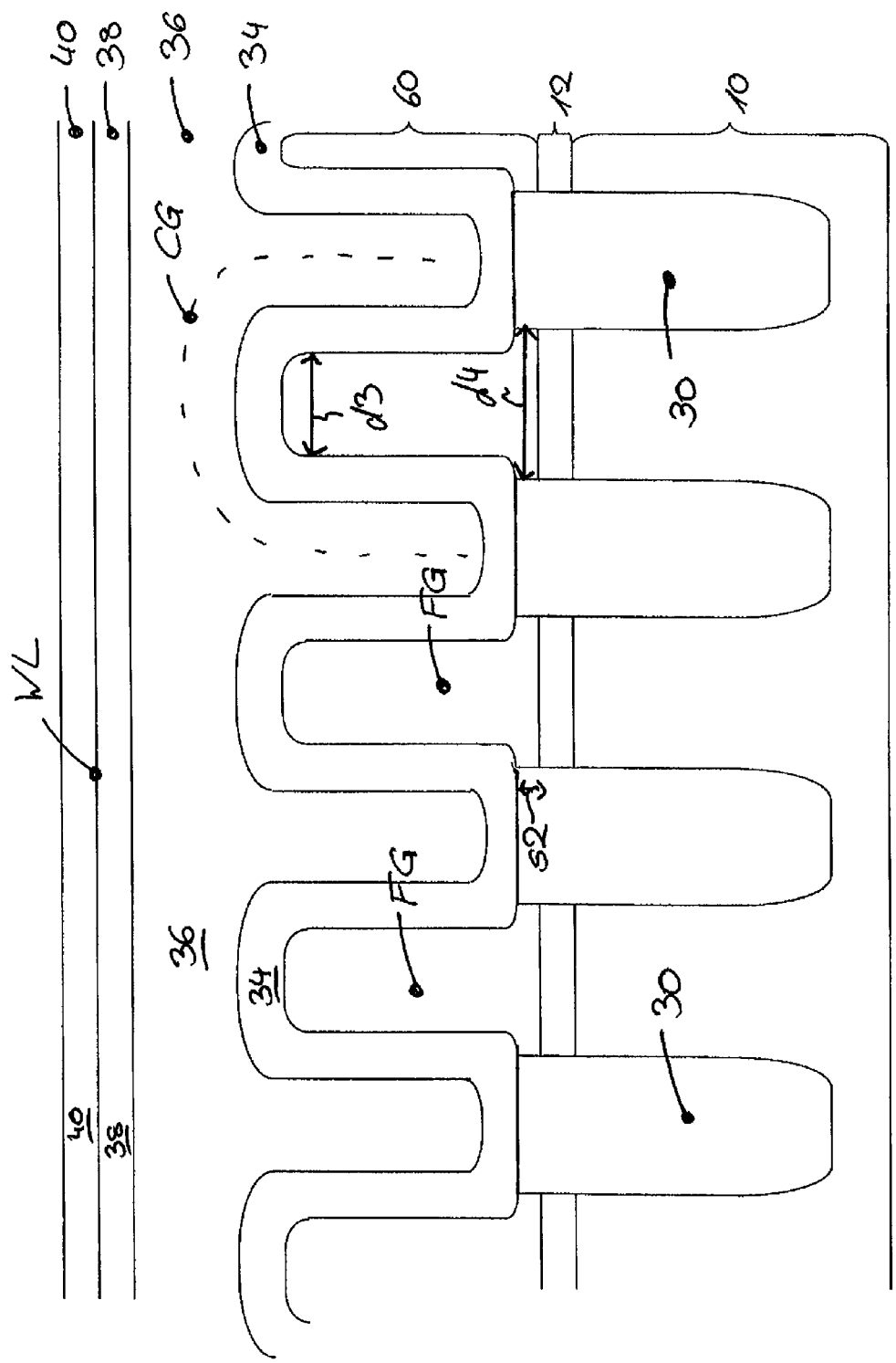

After the thermal oxidation step or after the wet etch step, oxide layer 18 and nitride layer 20 are etched away, for instance with hot phosphoric acid and hydrofluoric acid. Then, the FCW-method is performed to form control-gate electrodes CG and wordlines WL. The result is shown in FIG. 3C.

Figure 4A:
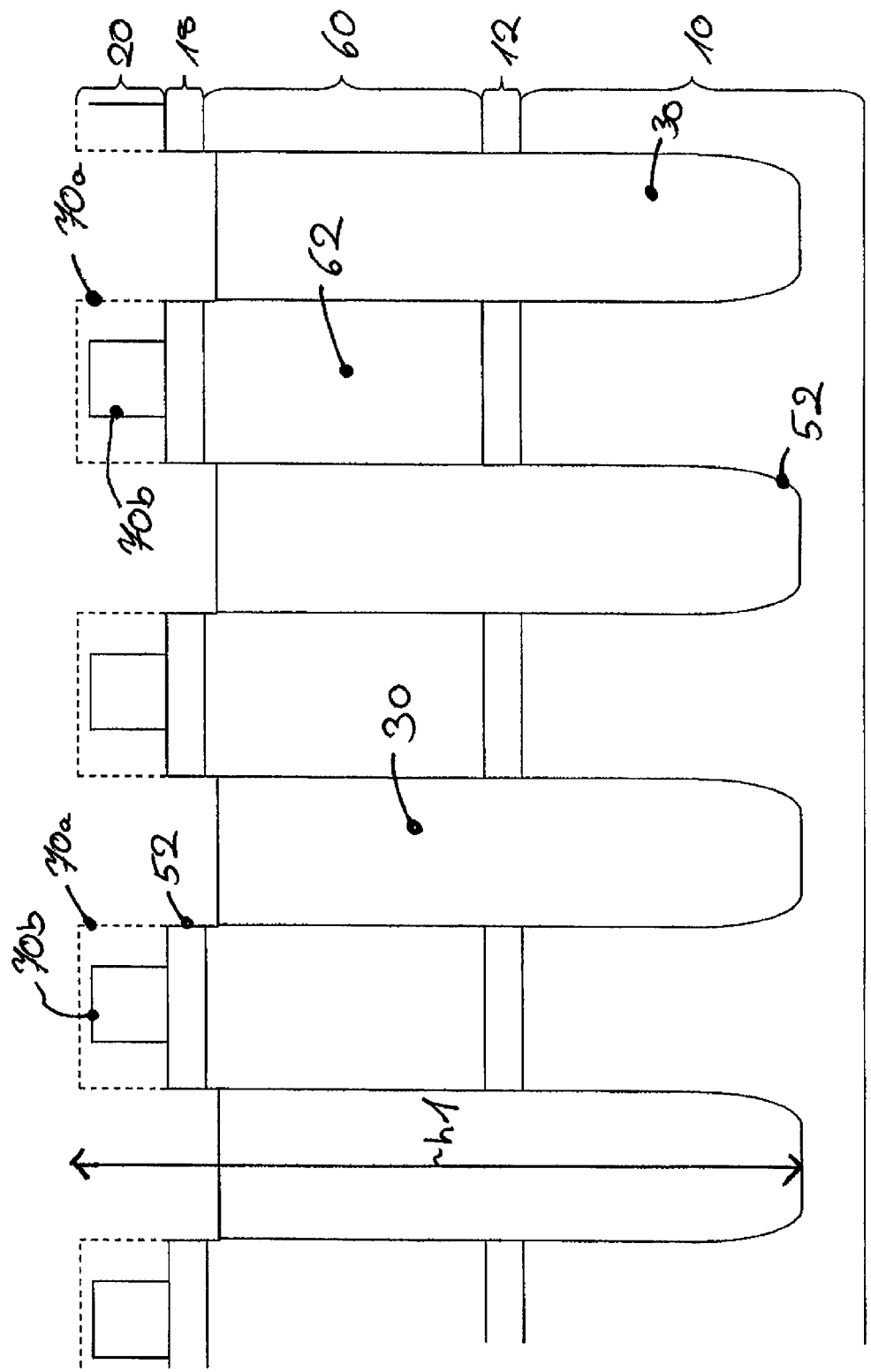
FIGS. 4A and B show cross sections of another semiconductor structure for illustrating another approach of the manufacturing method.

FIGS. 4A and B show cross sections of another semiconductor structure for illustrating another approach of the manufacturing method.

According to the PMSS-method explained above, a semiconductor structure comprising a semiconductor substrate 10, an insulation layer 12, a layer of floating-gate electrode material 60, an oxide layer 18 and a nitride layer 20 is produced. The layer of floating-gate electrode material 60 may include polysilicon and/or at least one transition metal. For example, the layer of floating-gate electrode material 60 may include iridium, ruthenium, a transition metal oxide, a transition metal silicide, a transition metal boride, a transition metal aluminide, a transition metal carbide and/or a transition metal nitride. In another approach, the layer of floating-gate electrode material 60 may include at least two layers of different materials.

To etch the trenches 52 shown in FIG. 4A, the ET-method is repeated. The newly etched trenches 52 extend from the surface of the semiconductor structure into the semiconductor substrate 10. Their height h1 may be in a range between 250 nm to 350 nm. The trenches 52 are completely filled with an STI-fill 30. Then, a CMP step is carried out to remove the STI-fill 30 protruding above the nitride layer 20. In a subsequent process step, a RIE etch is performed to partially reset the STI-fill 30 of the trenches 52. The surface of the STI-fill 30 is now below the oxide layer 18. Then, the first mask (not shown) of the ET-method is removed.

After the removal of the first mask, a nitride pullback etch (NPE) step is carried out. Before the NPE step is carried out, the nitride spacers 70a cover the oxide layer 18 completely.

The NPE step is performed to get a nitride mask for a following etch step to form oxide spacers 32 of the oxide of layer 18 and floating-gate electrodes FG of the material of layer 60. The NPE step is a wet chemical etch step, for instance with hot phosphoric acid. The oxide layer 18 is not sensitive against this wet chemical etch step. Therefore, only the size of the nitride spacers 70a is decreased by the wet chemical etch step. The newly formed nitride spacers 70b are shown in FIG. 4A.

After the NPE step, a RIE step is performed. The nitride spacers 70b are not sensitive to this RIE step. Therefore, the size of the nitride spacers 70b is not decreased by the RIE step.

However, the RIE step attacks the unprotected material of the layers 18 and 60. Therefore, only the part of the oxide layer 18 which is protected by the nitride spacers is not etched away. Thus, oxide spacers 32 are formed. The nitride spacers 70b and the oxide spacers 32 serve as a mask to form floating-gate electrodes FG with an inverse-T shape.

Figure 4B:
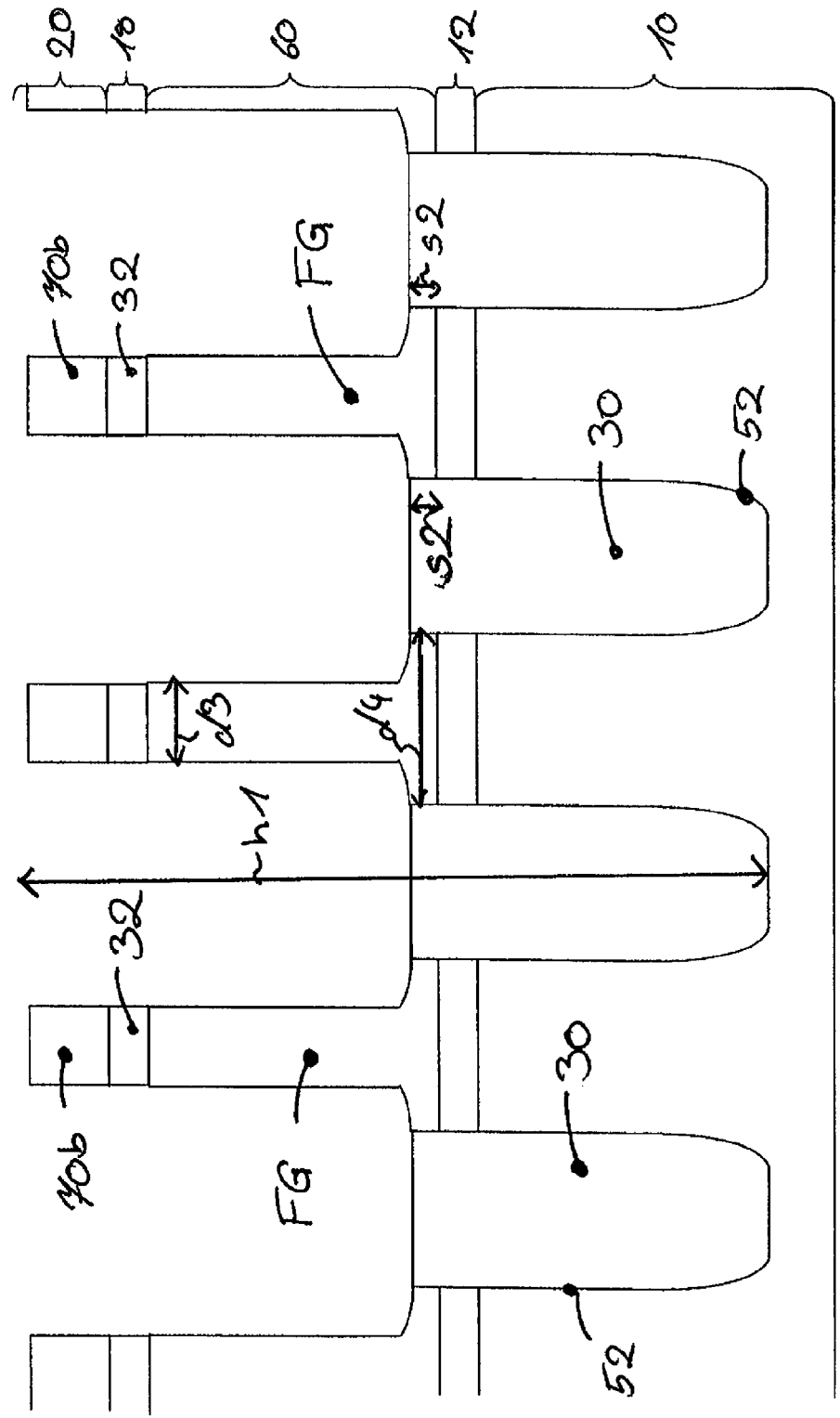

The RIE step is performed till the surface of the STI-fill 30 is within the distance s2 from the insulation layer 12. The result of the RIE step is shown in FIG. 4B.

A thermal oxidation step may be performed to oxidise the exposed surfaces of the floating-gate electrodes FG. The (not shown) oxide layers formed by this thermal oxidation step may be etched away. The thermal oxidation step and the following etching step may be carried out to remove the damaged zones of the floating-gate electrodes FG and to reduce the widths of the floating-gate electrodes FG further. The oxide spacers 32 are not attacked during this etching step, because they are protected by the nitride spacers 70b.

In a following etch step, carried out for example with hot phosphoric acid, the nitride spacers 70b are removed from the semiconductor structure. The oxide spacers 32 are not sensitive against this etch step. Therefore, the oxide spacers 32 are not removed from the floating-gate electrodes FG during this etch step.

In the following process steps, control-gate electrodes CG and wordlines WL are formed according the FCW-method explained above.

Figure 5A:
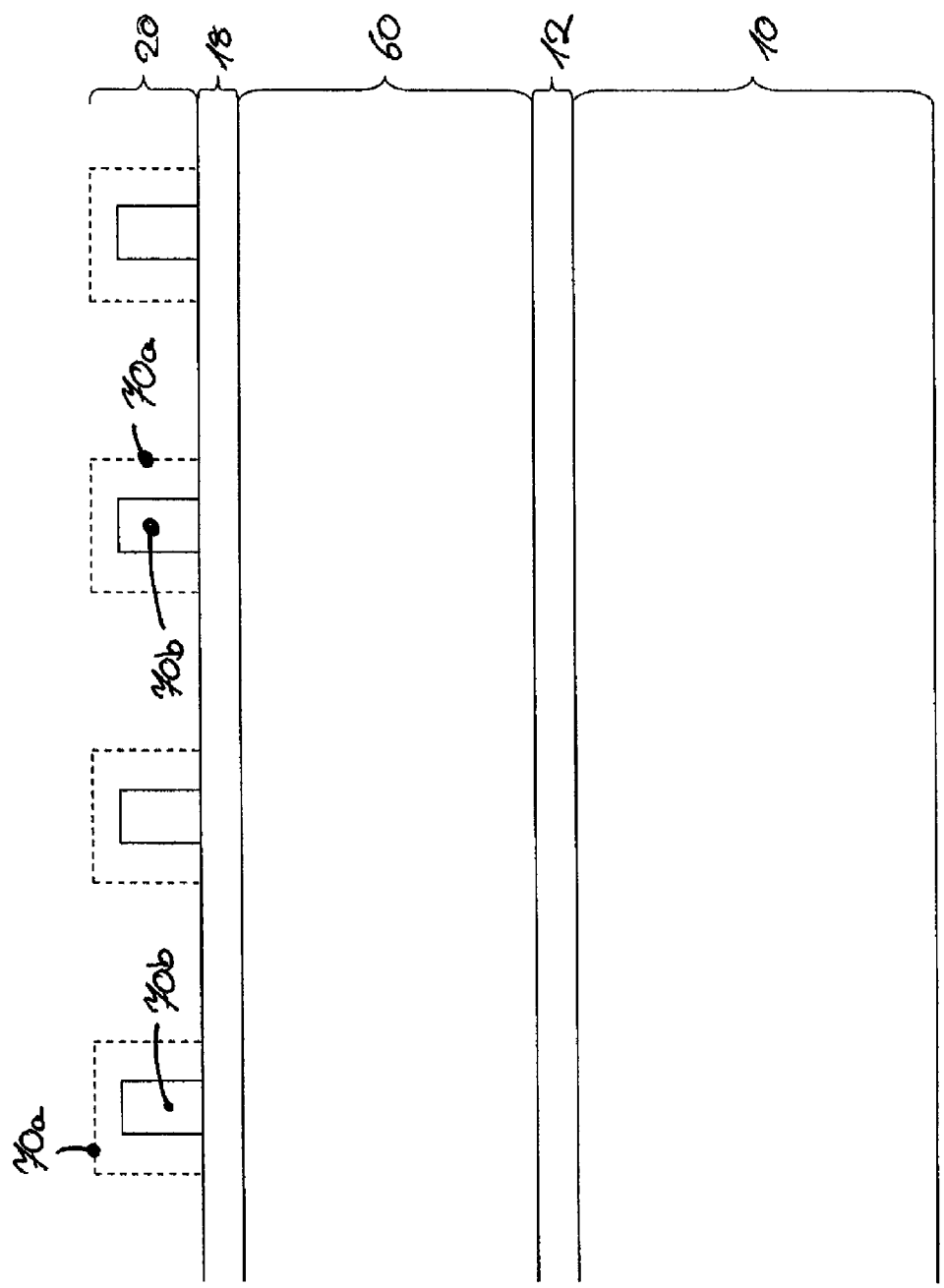
FIGS. 5A-5C show cross sections of another semiconductor structure for illustrating another approach of the manufacturing method.
Figure 5B:
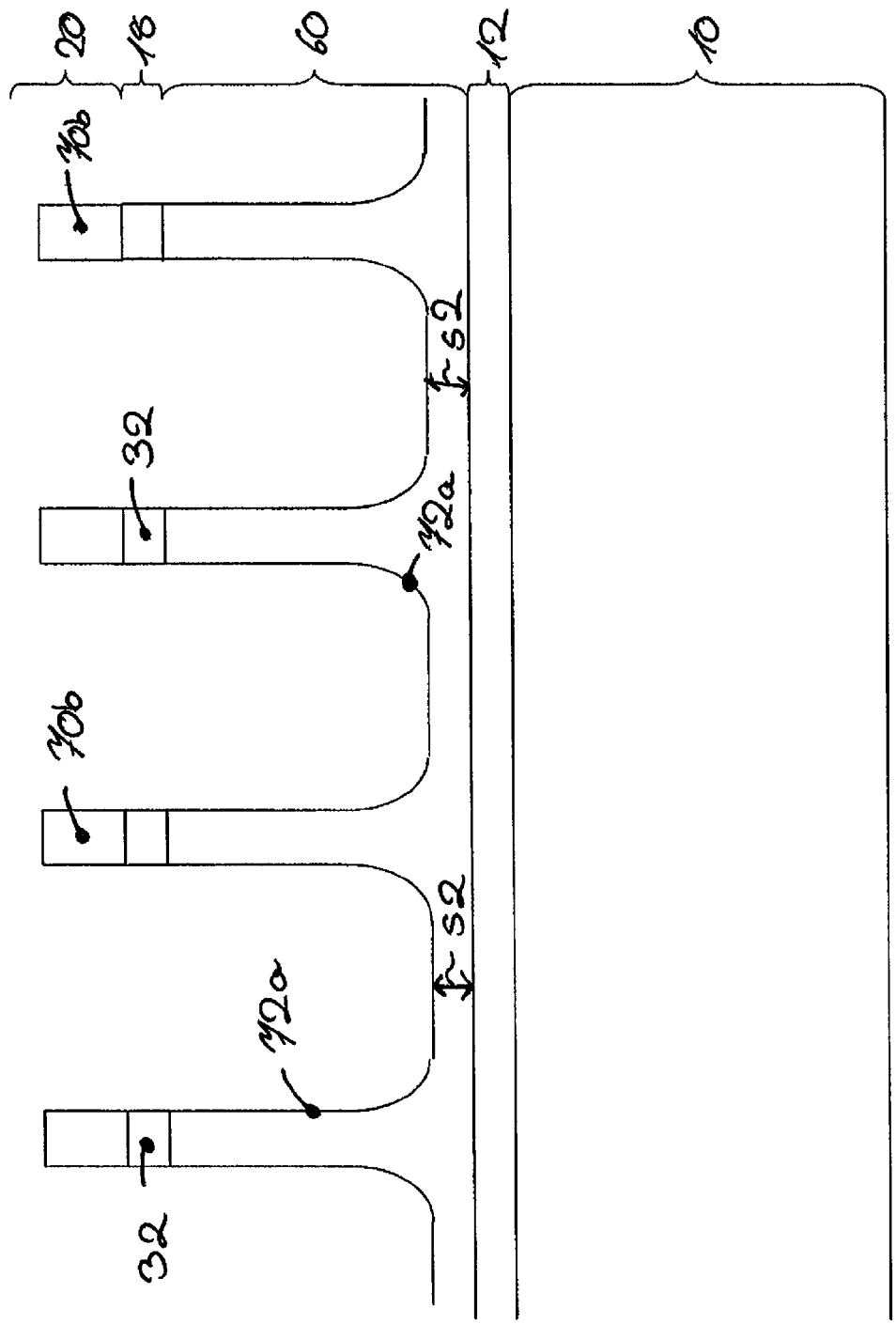
Figure 5C:
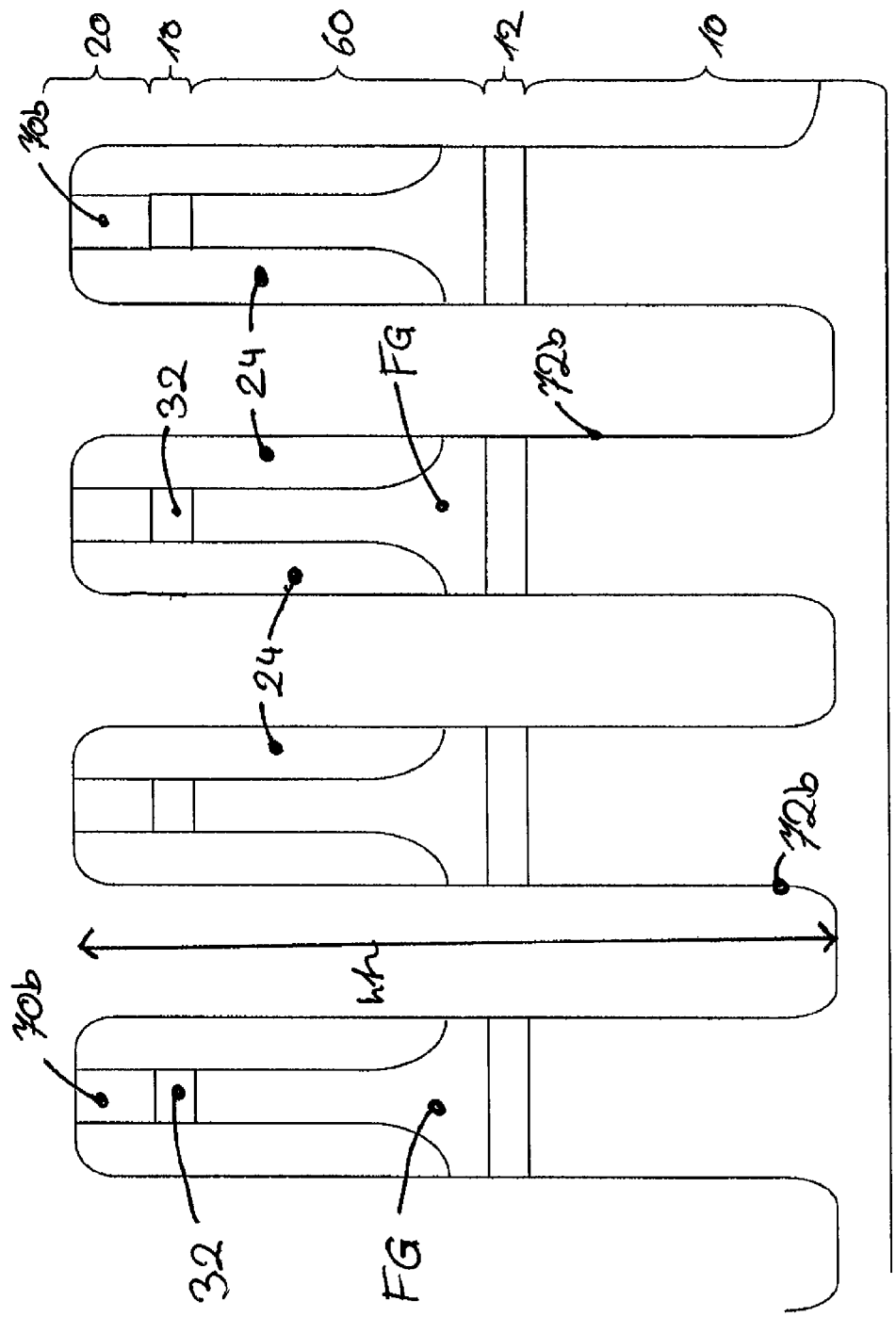

FIGS. 5A-5C show cross sections of another semiconductor structure for illustrating another approach of the manufacturing method.

A semiconductor structure is produced according to the PMSS-method. The semiconductor structure includes a semiconductor structure 10, an insulation layer 12, a layer of floating-gate electrode material 60, an oxide layer 18 and a nitride layer 20. Several examples for the material of the layer of floating-gate electrode material 60 are given above.

A method of forming a mask of nitride spacers (FMNS-method) is performed: First, a (not shown) first mask is deposited on the surface of the nitride layer 20. Some areas of the mask which cover the interspaces of the (later etched) nitride spacers are exposed in a following lithographic step. In a subsequent etching step, nitride spacers 70a are formed of nitride layer 20 (see broken lines in FIG. 5A). In a further process step of the FMNS-method, the first mask is removed.

In a following process step, the width of the nitride spacers 70a is decreased by an isotropic etch step. The newly formed nitride spacers 70b are shown in FIG. 5A.

The nitride spacers 70b serve as a mask during the following RIE step which does not attack the nitride spacers 70b but etches the material of the layers 18 and 60. During the RIE step, trenches 72a are etched which extend into the layer of floating-gate electrode material 60. Thus, the upper parts of floating-gate electrodes FG with an inverse-T shape are formed of the layer of floating-gate electrode material 60. The RIE step is continued till the bottom of the trenches 72a is within the distance s2 from the interface of the layers 12 and 60. The result of the RIE step is shown in FIG. 5B.

Then, nitride spacers 24 which cover the sidewalls of the trenches 72a are formed according to FNS-method. Only the bottom of the trenches 72a is not protected by the nitride spacers 24.

A second RIE etch is performed to increase the depth of the trenches 72a. During this second RIE etch, the exposed material at the bottoms of the trenches 72a is attacked. The second RIE step is stopped when the total height h1 of the trenches 72b is within a range between 250 nm to 350 nm.

Thus, the lower parts of the floating-gate electrodes FG with inverse-T shape are formed. The result of the second RIE step is shown in FIG. 5C.

The newly formed trenches 72b are partially filled with a STI-fill 30. The nitride spacers 24 are removed by an etching step carried out with hot phosphoric acid. The oxide spacers 32 formed on the floating gate electrodes are not removed.

In and additional process step, control-gate electrodes CG and wordlines WL may be formed according to the FCW-method.

Figure 6A:
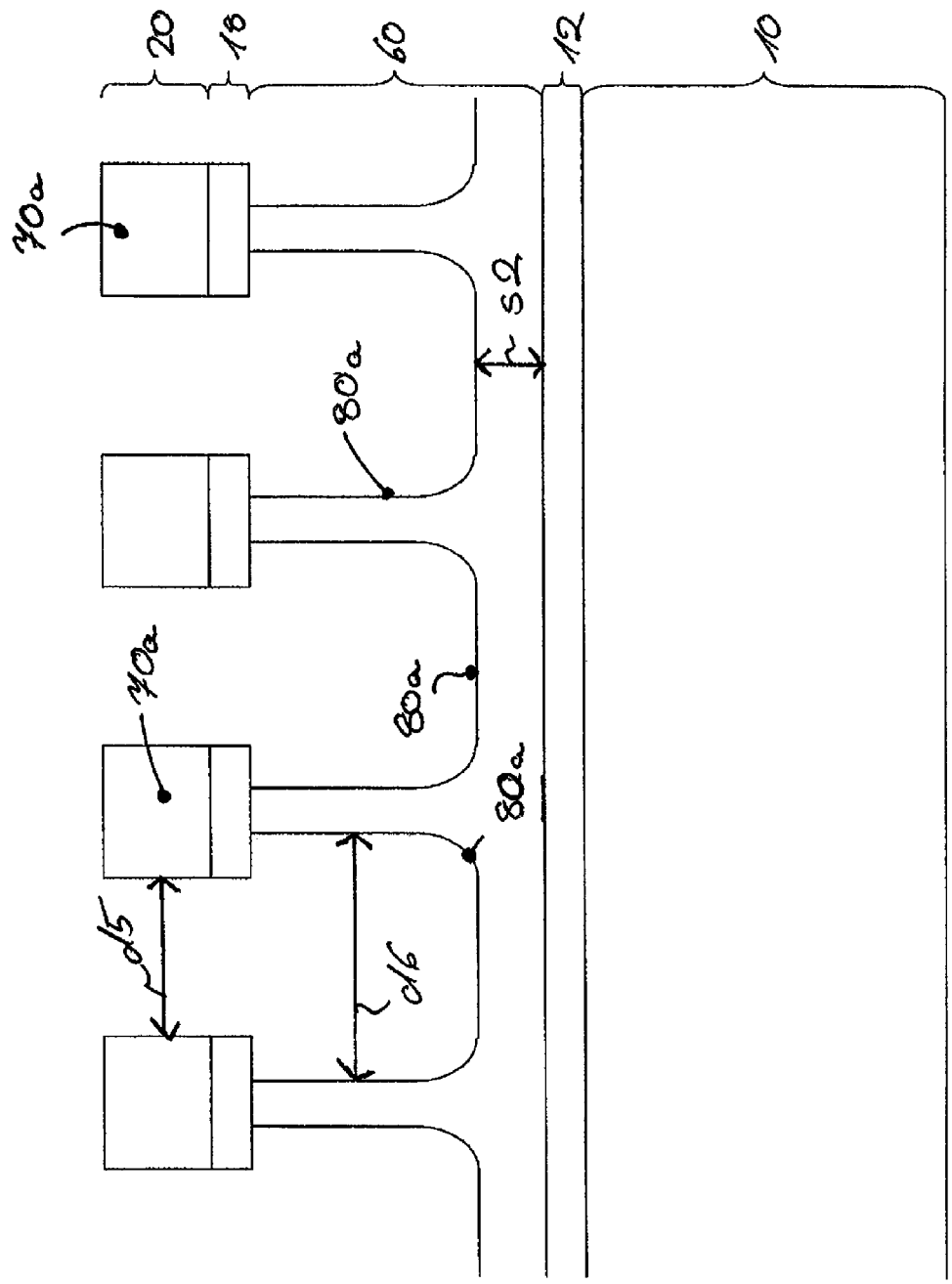
FIGS. 6A, 6Ba and 6Bb show cross sections of another semiconductor structure for illustrating another approach of the manufacturing method.
Figure 6B:
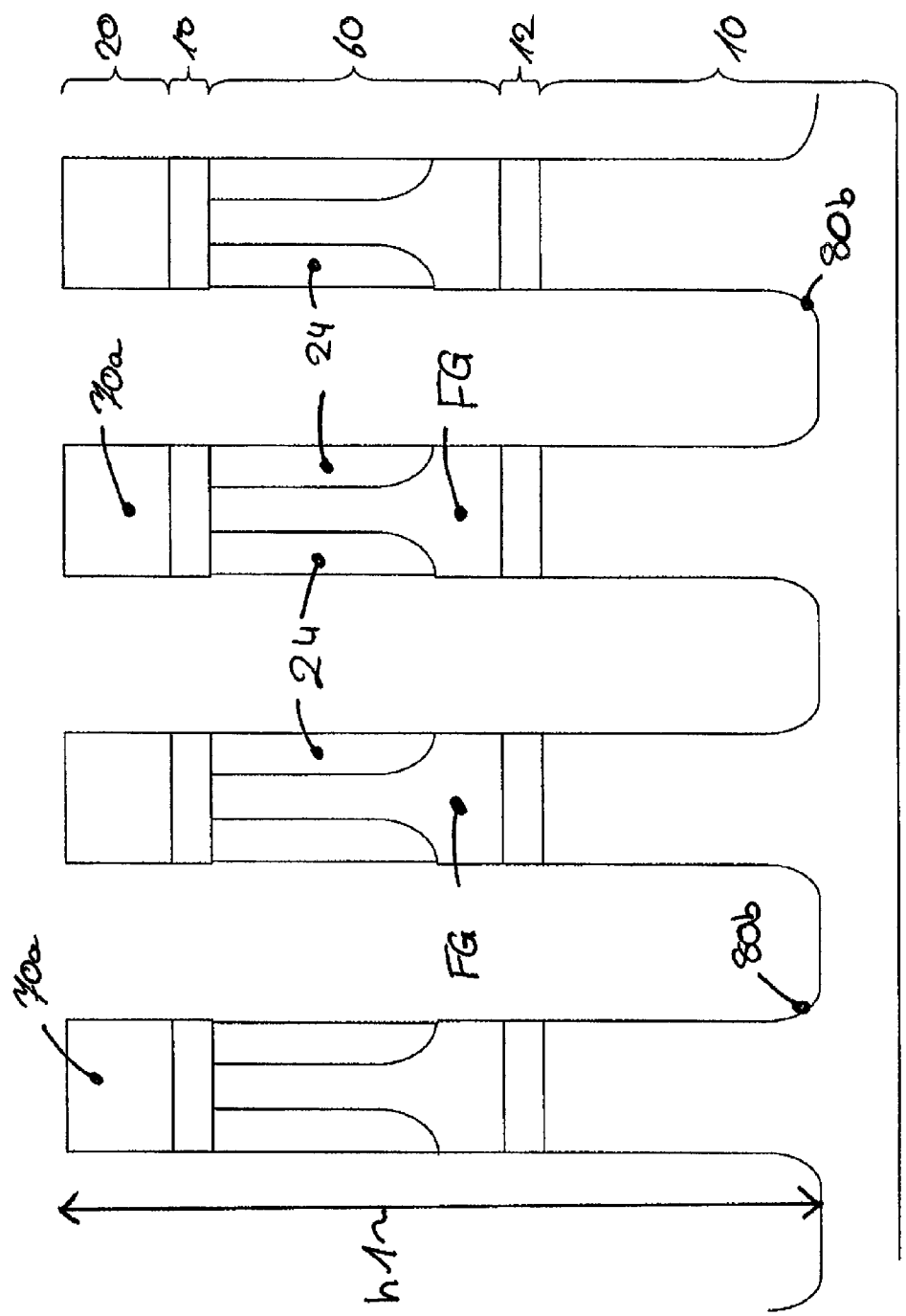
Figure 6B:
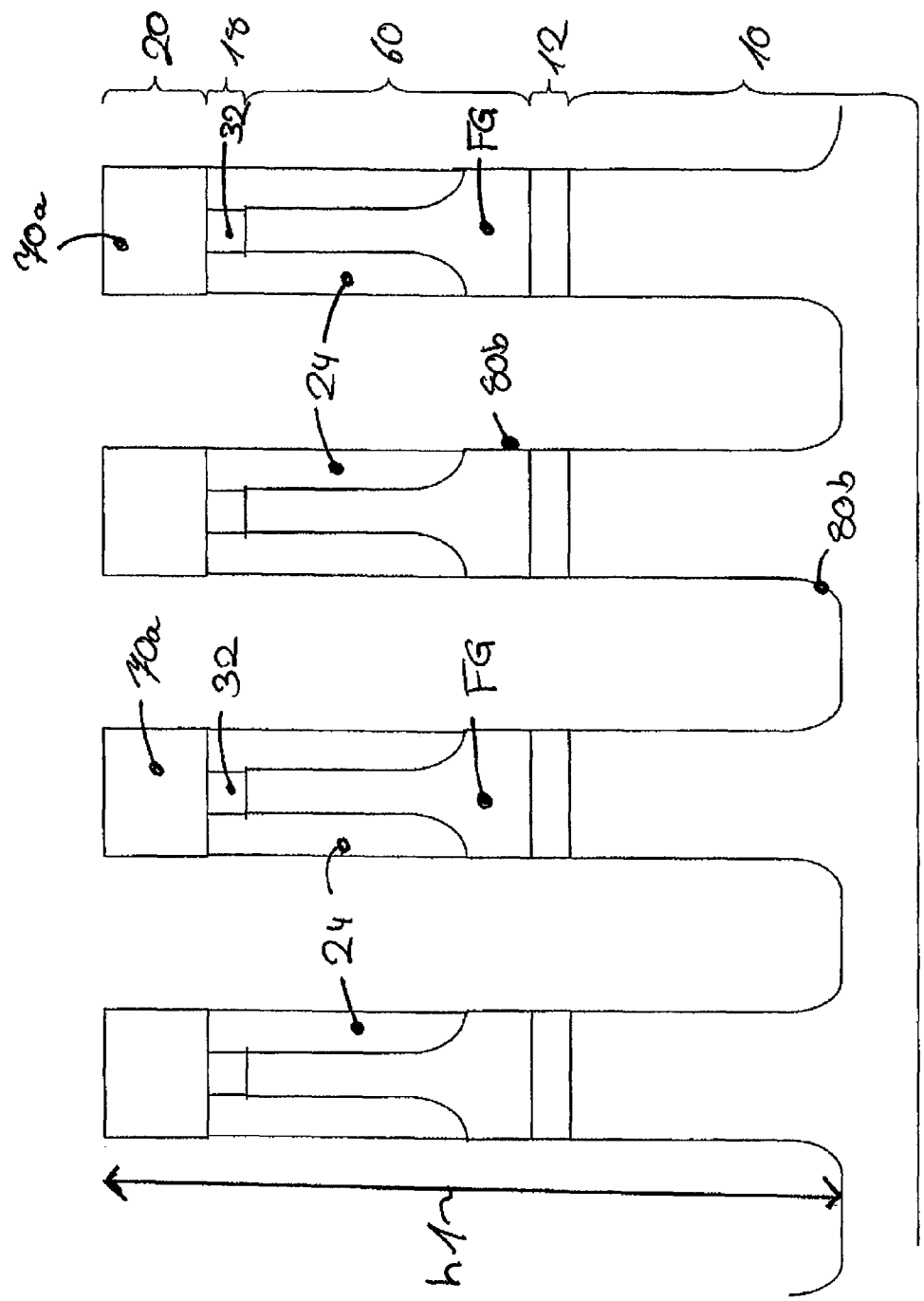

FIGS. 6A, 6Ba and 6Bb show cross sections of another semiconductor structure for illustrating another approach of the manufacturing method.

According to the PMSS-method, a semiconductor structure comprising a semiconductor substrate 10, an insulation layer 12, a layer of floating-gate electrode material 60, an oxide layer 18 and a nitride layer 20 is produced. The layer of floating-gate electrode material 60 may include polysilicon and/or at least one transition metal. For example, the layer of floating-gate electrode material 60 may include iridium, ruthenium, a transition metal oxide, a transition metal silicide, a transition metal boride, a transition metal aluminide, a transition metal carbide and/or a transition metal nitride. It is also possible to deposit at least two layers of these materials to form floating-gate electrodes FG from their materials according to the method explained below.

Then, a mask of nitride spacers 70a is formed of the nitride layer 20 according to the FMNS-method explained above.

A RIE step is performed to etch the exposed parts of the oxide layer 18. The RIE step is carried out with an etching material that does not attack the nitride spacers 70a or the material of layer 60. The RIE step is continued till the surface of the layer of floating-gate electrode material 60 is exposed in the interspaces of the nitride spacers 70a. Thus, the upper part of trenches 80a is etched. The upper parts of the trenches 80a have a first width d5.

An isotropic etch step is carried out to etch the lower parts of the trenches 80a into the layer 60. The lower parts of the trenches 80a have a second width d6 that is significantly larger than the first width d5. The etching material of the isotropic etch step does not attack nitride or oxide. Therefore, the width d5 of the upper part of the trenches 80a is not increased significantly during the isotropic etch step. The isotropic etch step is continued till the bottom of the trenches 80a is within the distance s2 of the insulation layer 12. The result of the isotropic etch step is shown in FIG. 6A.

In a next process step, nitride spacers 24 which cover the sidewalls of the trenches 80a are formed according to the FNS-method. These nitride spacers 24 only protect the sidewalls of the trenches 80a. The bottoms of the trenches 80a are exposed.

In a following RIE step, the unprotected material at the bottoms of the trenches 80a is etched to increase the depth of the trenches 80a. The RIE step is continued till the etched trenches 80b extend into the semiconductor substrate 10 and have a total height h1 in a range between 250 nm to 350 nm. The result of the RIE step is shown in FIG. 6Ba.

The nitride spacers 24, the nitride layer 20 and the oxide layer 18 are removed according to the methods explained above and the trenches 80b are filled with a STI-fill 30. Then, the FCW-method is performed to form control-gate electrodes CG and wordlines WL on the semiconductor structure.

As an alternative to the RIE step of this method, the oxide layer 18 may also be etched by the isotropic etch step. Thus, it is possible to form oxide spacers 32 on the floating-gate electrodes FG. The oxide spacers 32 are also protected during the following RIE step by the nitride spacers 24, as can be seen from FIG. 6Bb.

FIGS. 7A-7F show cross sections of another semiconductor structure for illustrating another approach of the manufacturing method.

A semiconductor structure is fabricated according to the PMSS-method. The semiconductor structure includes a semiconductor substrate 10, an insulation layer 12, a layer of floating-gate electrode material 60, an oxide layer 18 and a nitride layer 20. The layer of floating-gate electrode material 60 may include polysilicon and/or at least one transition metal, for instance a transition metal oxide, a transition metal nitride, a transition metal boride, a transition metal aluminide, a transition metal carbide and/or a transition metal silicide.

Figure 7A:
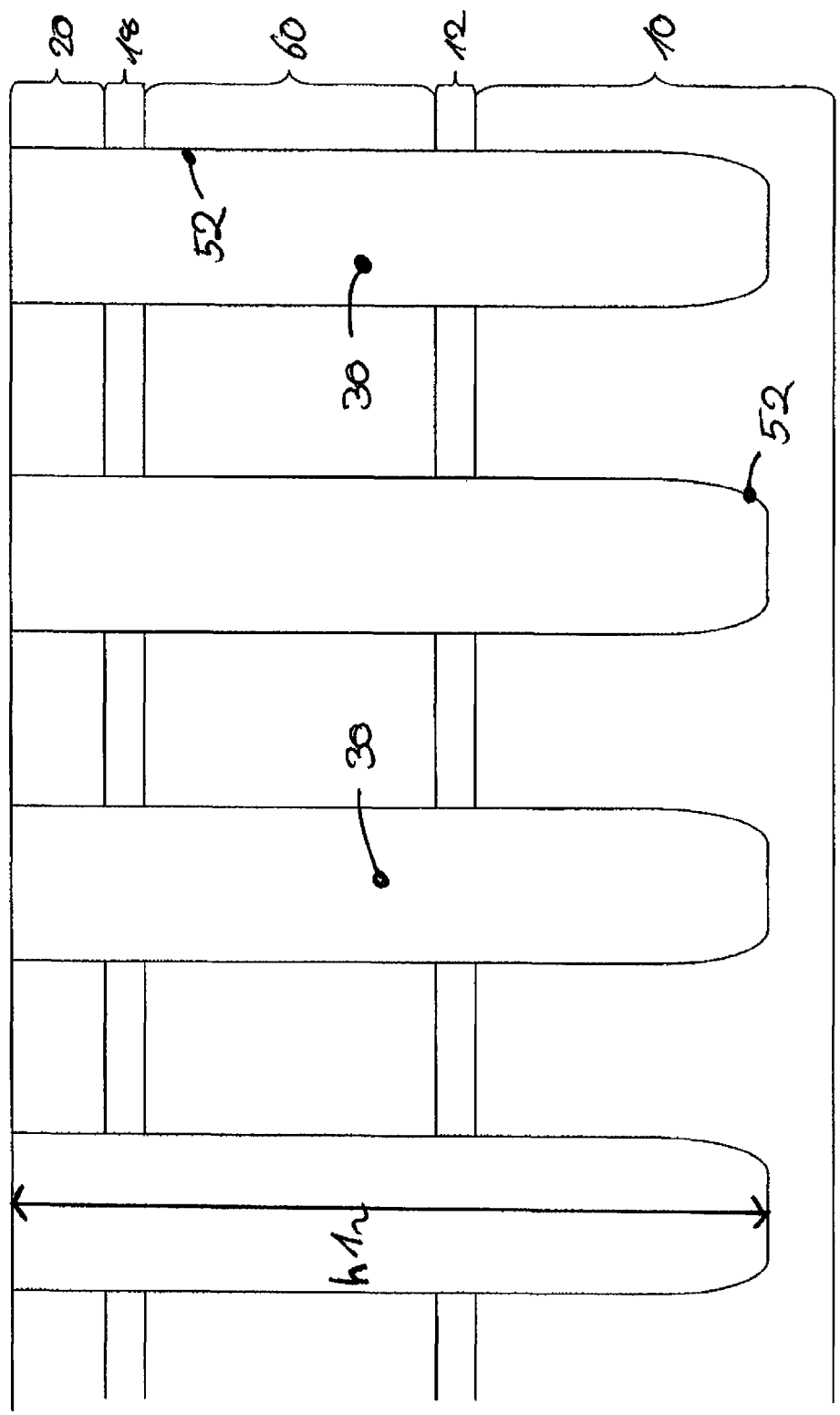

In a second process step, the already mentioned ET-method is carried out to etch trenches 52 into the semiconductor structure. These trenches 52 extend from the surface of the semiconductor structure into the semiconductor substrate 10. Their total height h1 of the trenches 52 may be in a range between 250 nm to 350 nm. The semiconductor structure with the trenches 52 is shown in FIG. 7A.

In a following process step, the trenches 52 are filled with a STI-fill 30. A CMP step may be performed to remove the STI-fill 30 protruding above the nitride layer 20. Then, the STI-fill 30 is partially removed from the trenches 52 till the surface of the STI-fill 30 is near to the surface of layer 60. Thus, the sidewalls of the nitride spacers 70a formed of nitride layers 20 are exposed. The mask build of the nitride spacers 70a is shown in (in broken lines) in FIG. 7B.

This mask of nitride spacers 70a is used to etch floating-gate electrodes FG. In a first step of the method of etching floating-gate electrodes FG (EFE-method) an isotropic etch step is performed to decrease the width of the nitride spacers 70a. This isotropic etch step has a rather short duration to make sure that the decrease of the width of the nitride spacers 70b is rather small, as can be seen from FIG. 7B.

Figure 7B:
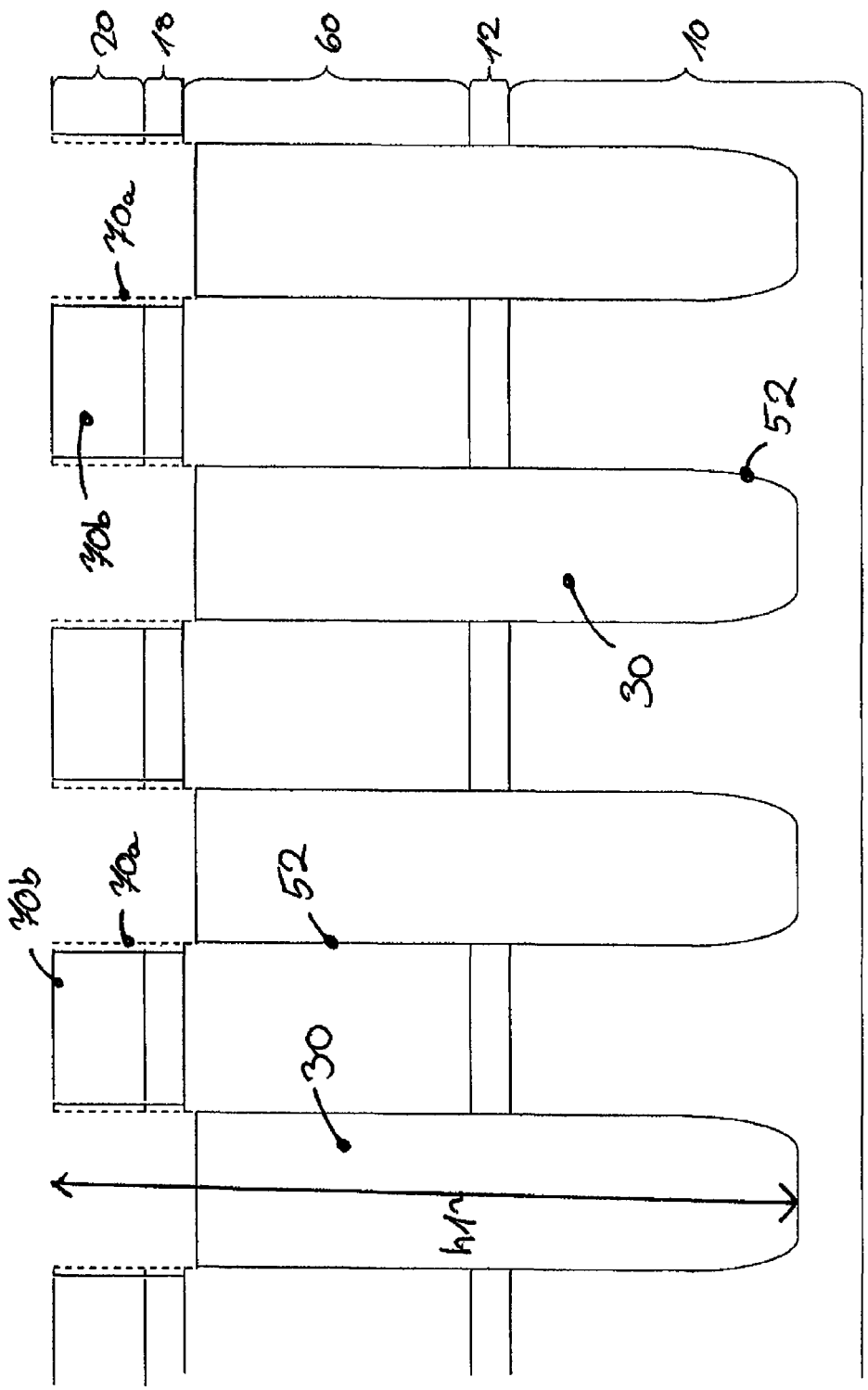
Figure 4C:
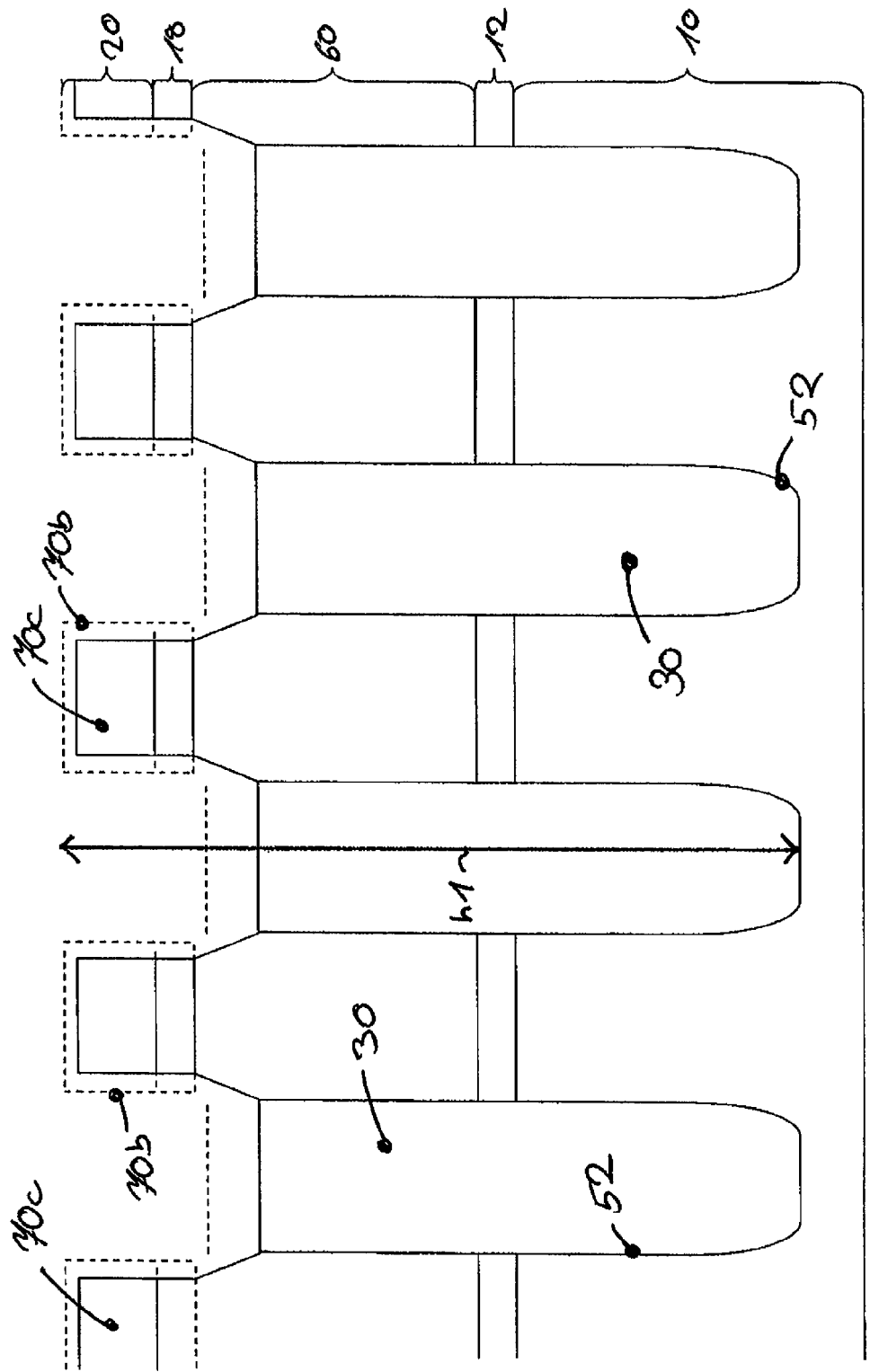

Then, a RIE step is performed to etch the exposed oxide of the oxide layer 18 and the exposed material of layer 60. This RIE step is continued for a rather short time to make sure that the surface of the STI-fill 30 is moved for a little distance in the direction to the insulation layer 12. The result is shown in FIG. 7B.

The nitride spacers 70b are not sensitive against the RIE step. Therefore, the decrease of the nitride spacers 70b during the RIE step is not significant.

In a following process step, the width of the nitride spacers 70b is decreased again by an isotropic etch step. The newly formed nitride spacers 70c are shown in FIG. 7C. (The broken lines mark the former size of the nitride spacers 70b.)

The RIE step is repeated, as can be seen from FIG. 7C.

Figure 7D:
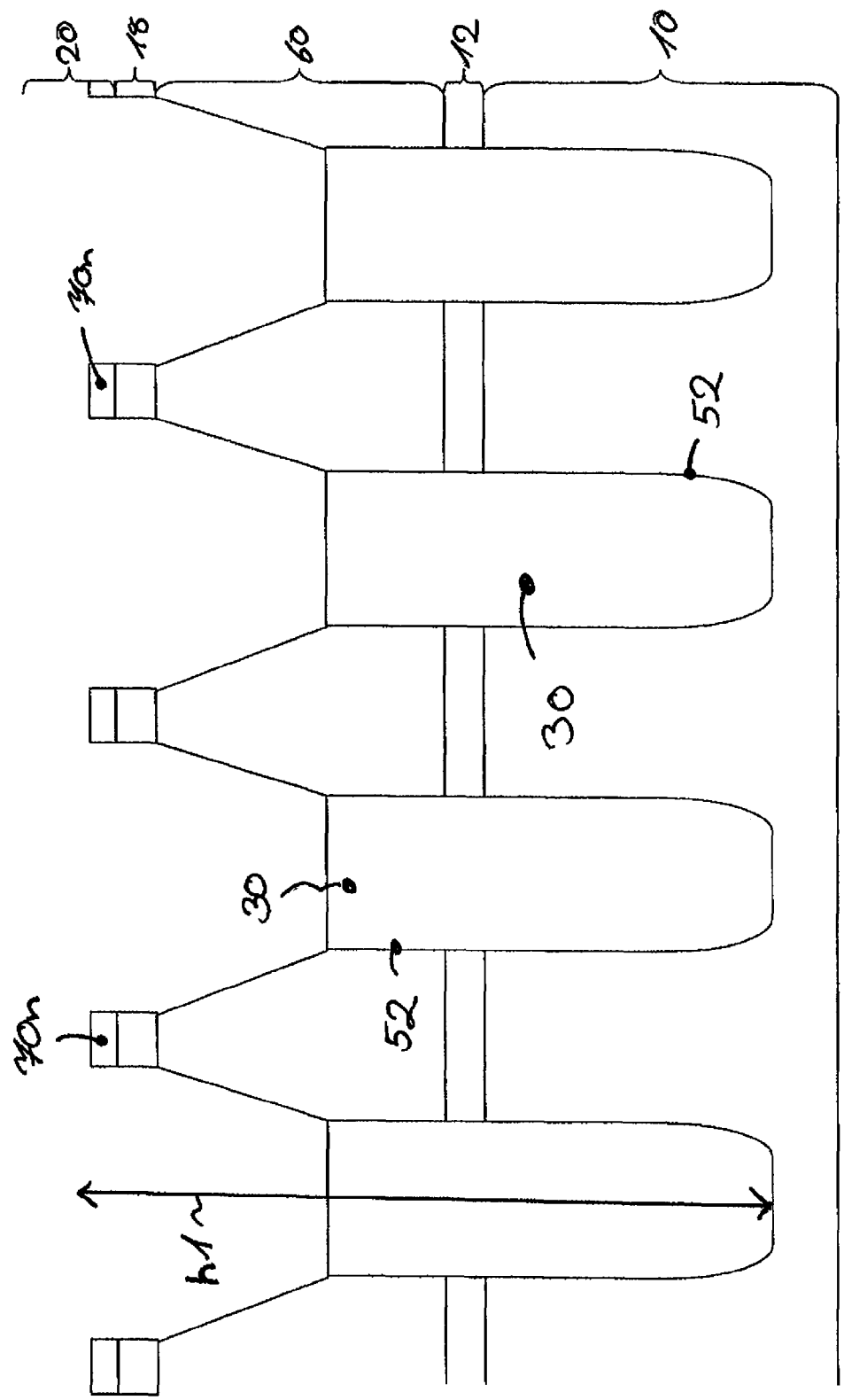

Thus, a RIE step is followed by an isotropic etch step and vice versa. Both etching steps are performed several times to make sure that the etched floating-gate electrodes FG get a staged shape. FIG. 7D shows another intermediate stage of the EFE-method.

Figure 7E:
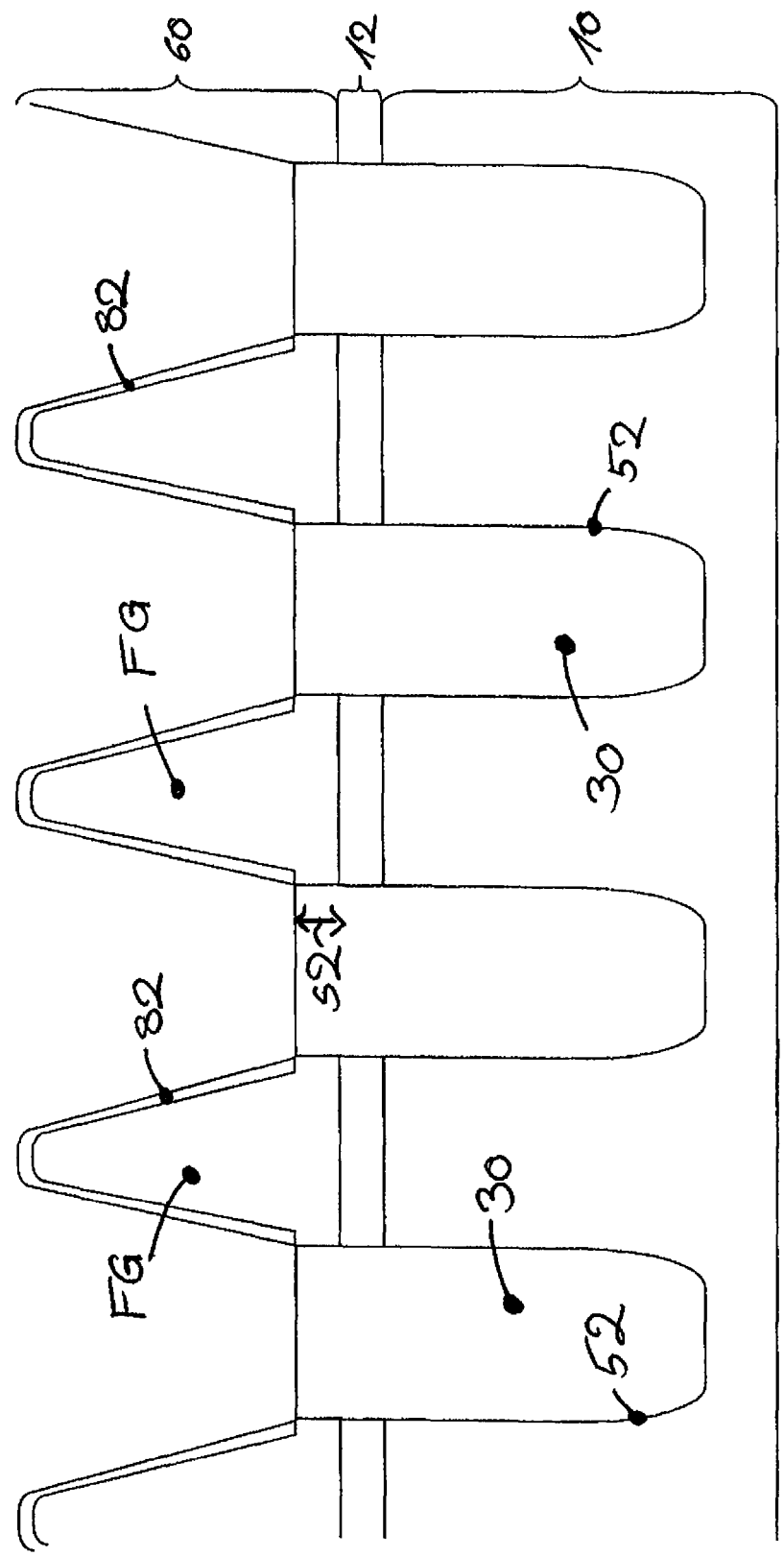

The EFE-method is continued till the surface of the STI-fill 30 is within the distance s2 of the insulation layer 12. The distance s2 may be in a range between 10 nm to 30 nm. The final shape of the newly etched floating-gate electrodes FG is shown in FIG. 7E. The cross sections of the floating-gate electrodes FG are now almost triangular.

In case that the materials of the layers 18 and 20 are not completely removed by the EFE-method, etching steps which specifically attack oxide and/or nitride may be carried out.

A thermal oxidation may be performed to form silicon oxide layers 82 on the exposed areas of the floating-gate electrodes FG (see FIG. 7E). The silicon oxide layers 82 are then etched away. The thermal oxidation and the following etching step may be done to remove damaged material of the floating-gate electrodes FG and to decrease the widths of the floating-gate electrodes FG further.

Figure 7F:
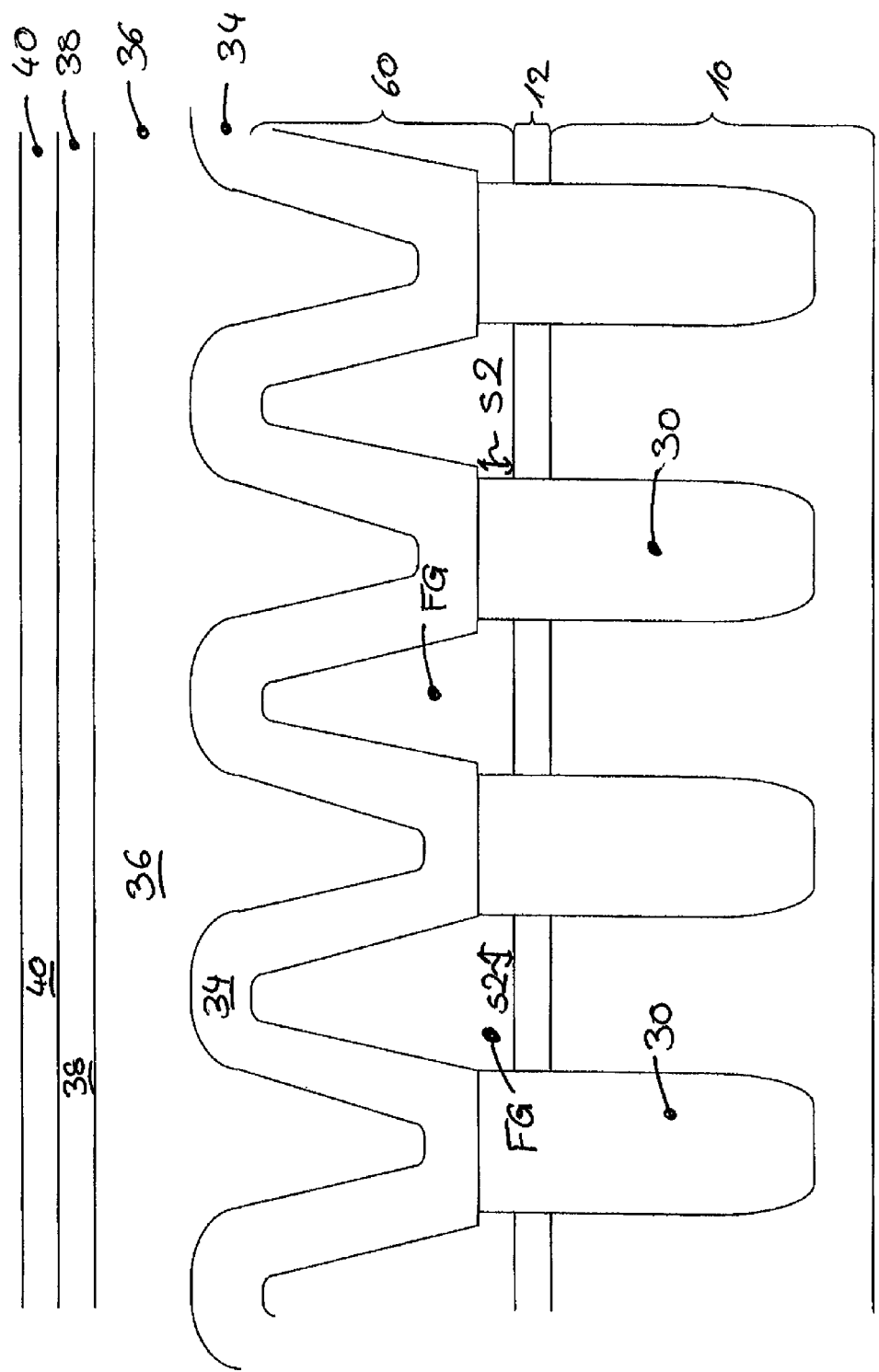

Even though the floating-gate electrodes FG shown in FIG. 7E have a rather triangular shape compared to the inverse-T shape of the floating-gate electrodes FG mentioned above, it is possible to form control-gate electrodes CG and wordlines WL on the triangle-shaped floating gate electrodes according to the FCW-method. The result of the FCW-method is shown in FIG. 7F.

FIGS. 8A-8F show cross sections of another semiconductor structure for illustrating another approach of the manufacturing method.

Figure 8A:
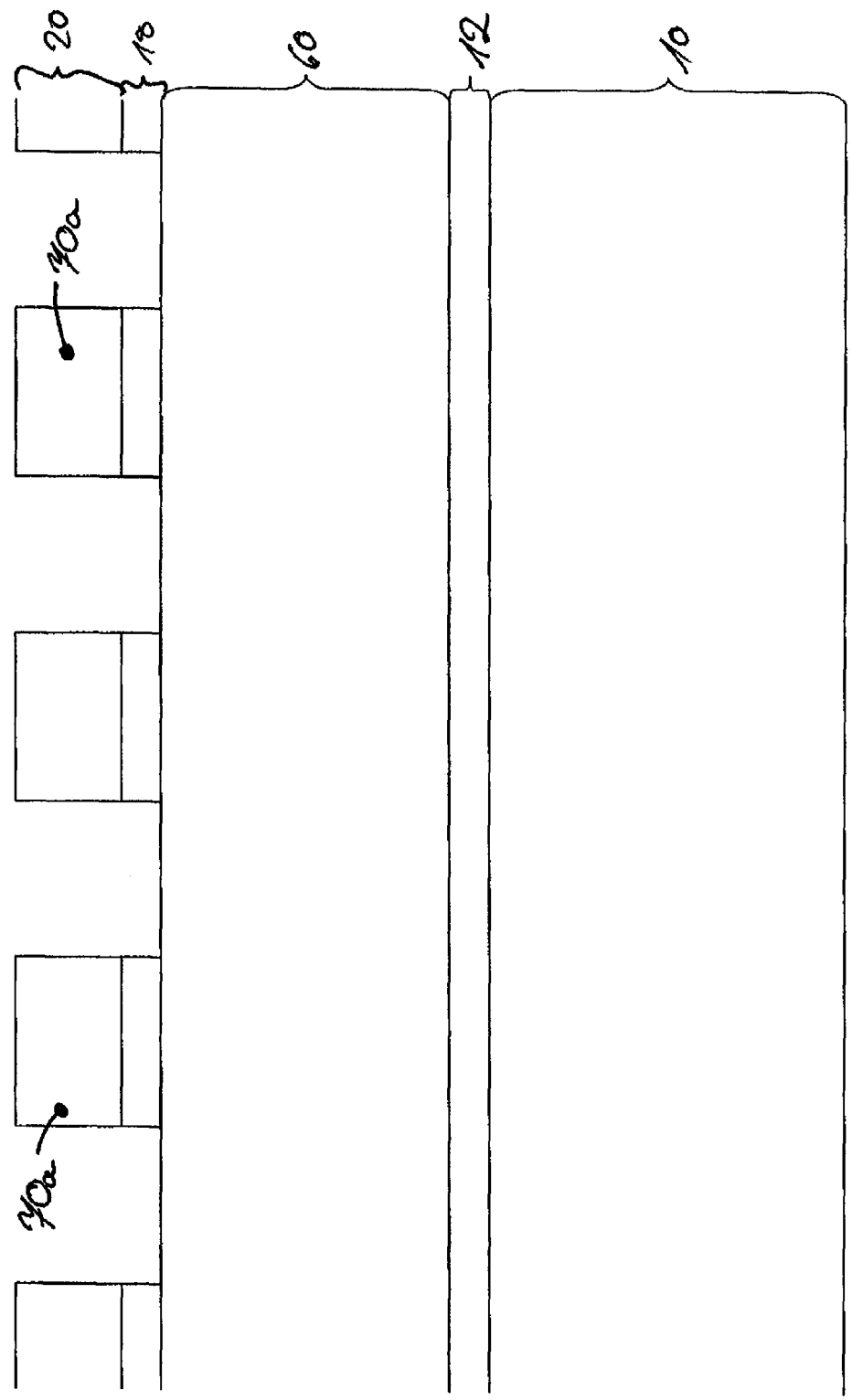

FIG. 8A shows a semiconductor structure comprising a semiconductor substrate 10, an insulation layer 12, a layer of floating-gate electrode material 60, an oxide layer 18 and a nitride layer 20. The semiconductor structure may be produced according to the PMSS-method.

Then, a mask of nitride spacers 70a is formed of the nitride layer 20 according to the FMNS-method. Those parts of the oxide layer 18, which are not protected by the nitride spacers 70a, are etched away. This is done till some areas of the surface of layer 60 are exposed, as can be seen from FIG. 8A.

Figure 8B:
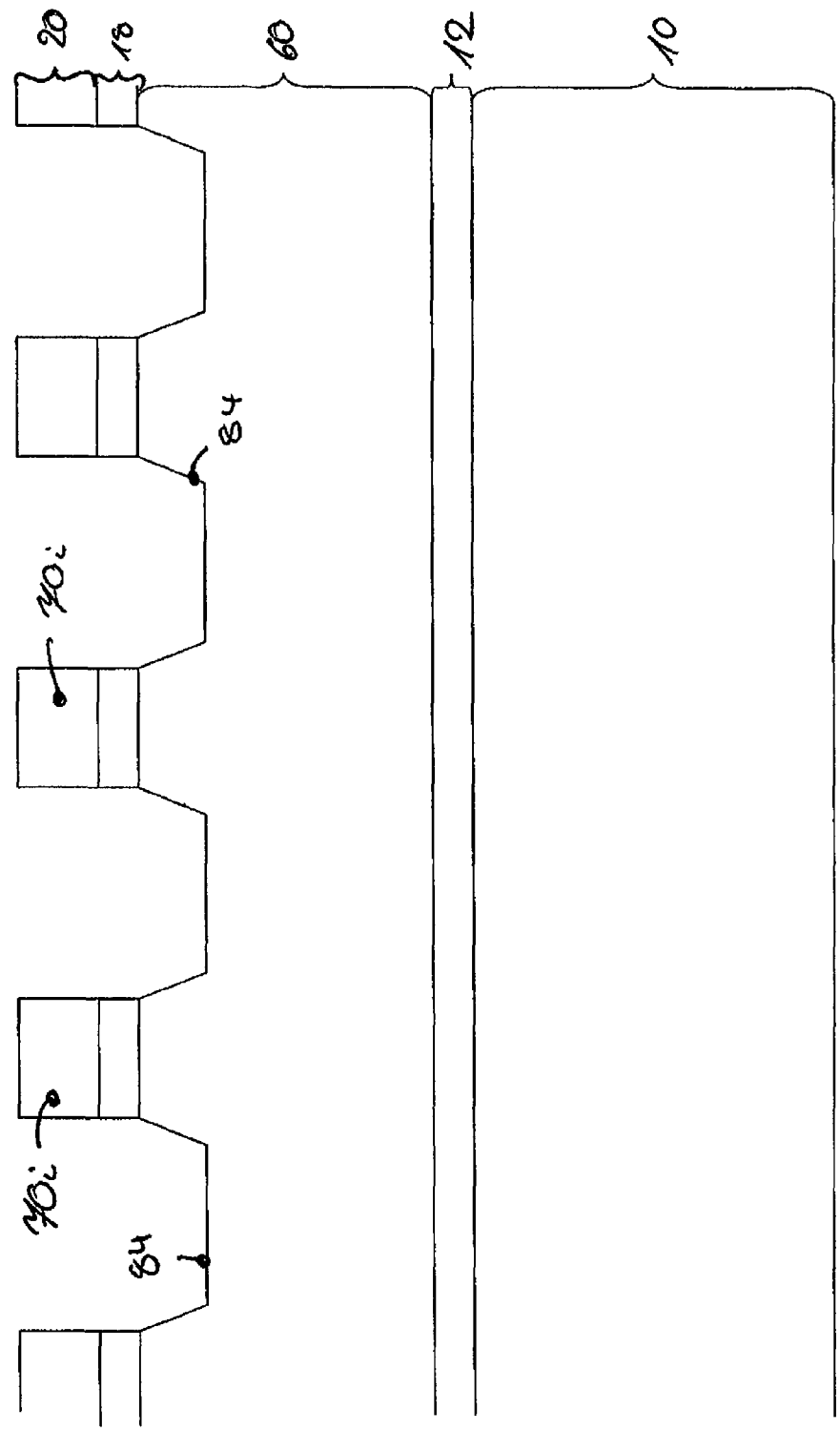
Figure 8C:
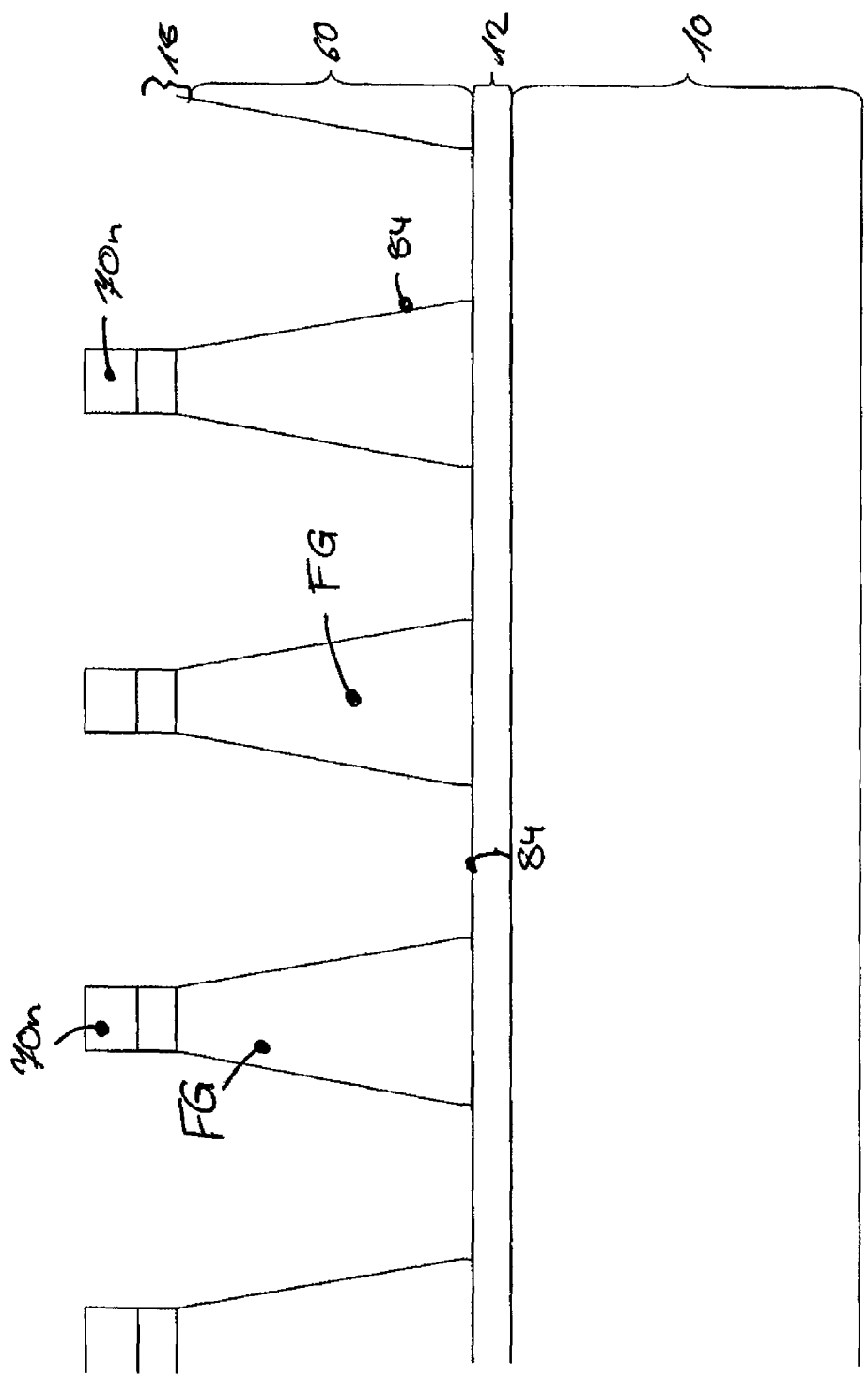
Figure 8E:
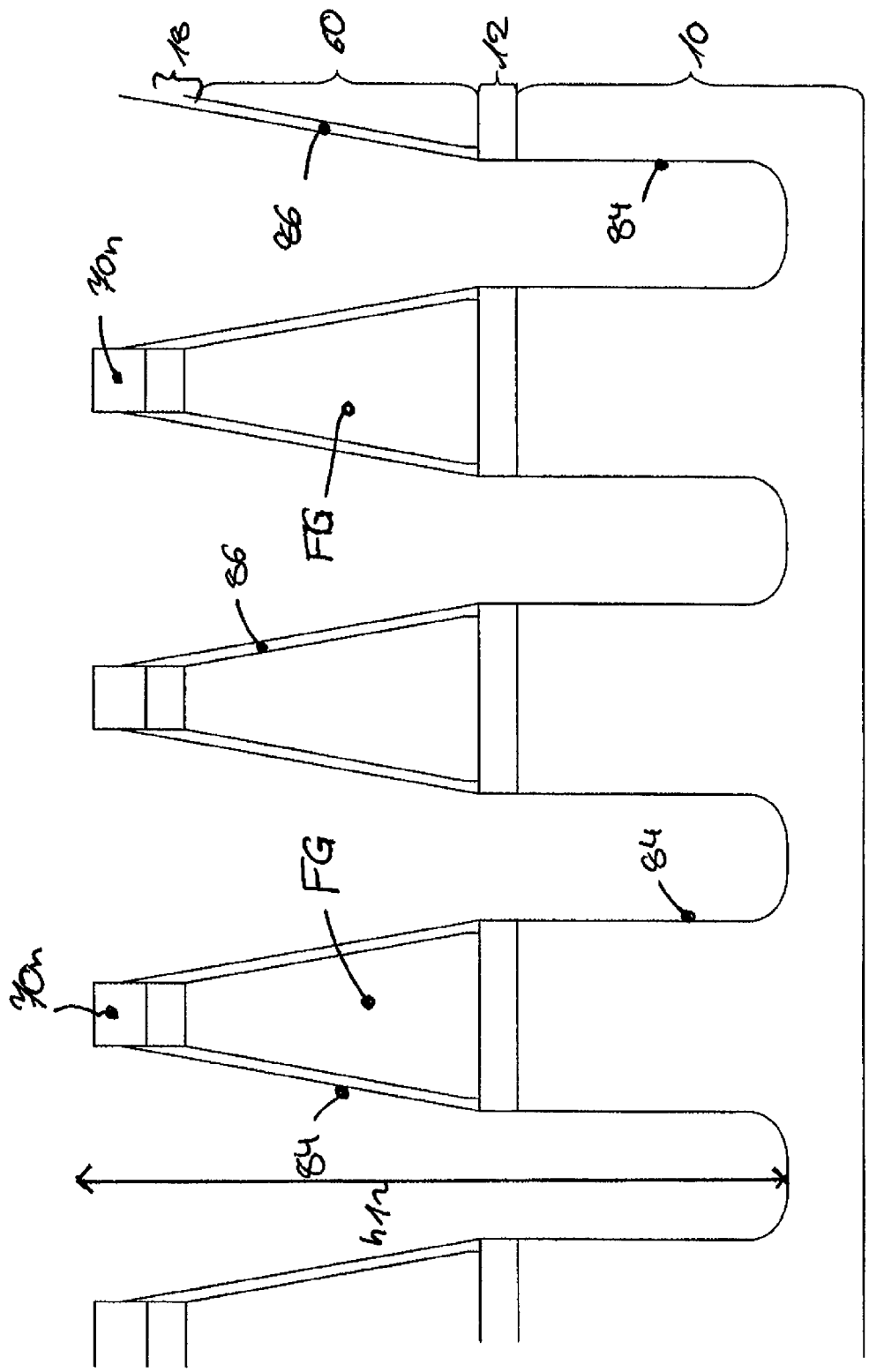

The EFE-method is started and continued till trenches 84 are etched that extend to the surface of the insulation layer 12. Thus, floating-gate electrodes FG that have an almost triangular shape are etched. FIGS. 8B and 8C show an intermediate stage and a further stage of the EFE-method.

After the EFE-method, a thermal oxidation step is carried out to grow a (not shown) thin oxide layer with a layer thickness about 2 nm on the exposed areas of the floating gate electrodes FG. Then, a nitride layer 86 is deposited on the surface of the semiconductor structure. A mask is formed on the nitride layer 20. The areas of the mask which cover the bottoms of the trenches 84 are exposed in a lithographic step. In the following RIE step, the nitride layer 86 is removed from the bottoms of the trenches 84. Only the nitride covering the sidewalls of the floating-gate electrodes FC is protected by the mask during the RIE step. Thus, the nitride spacers 86 shown in FIG. 8D are formed.

Another RIE step is carried out to etch the exposed material at the bottoms of the trenches 84 and to increase the depth of the trenches 84. This RIE step is continued till the trenches 84 extend into the semiconductor substrate 10 (see FIG. 8E). The total height hi of the trenches 84 is in a range between 250 nm to 350 nm.

Figure 8F:
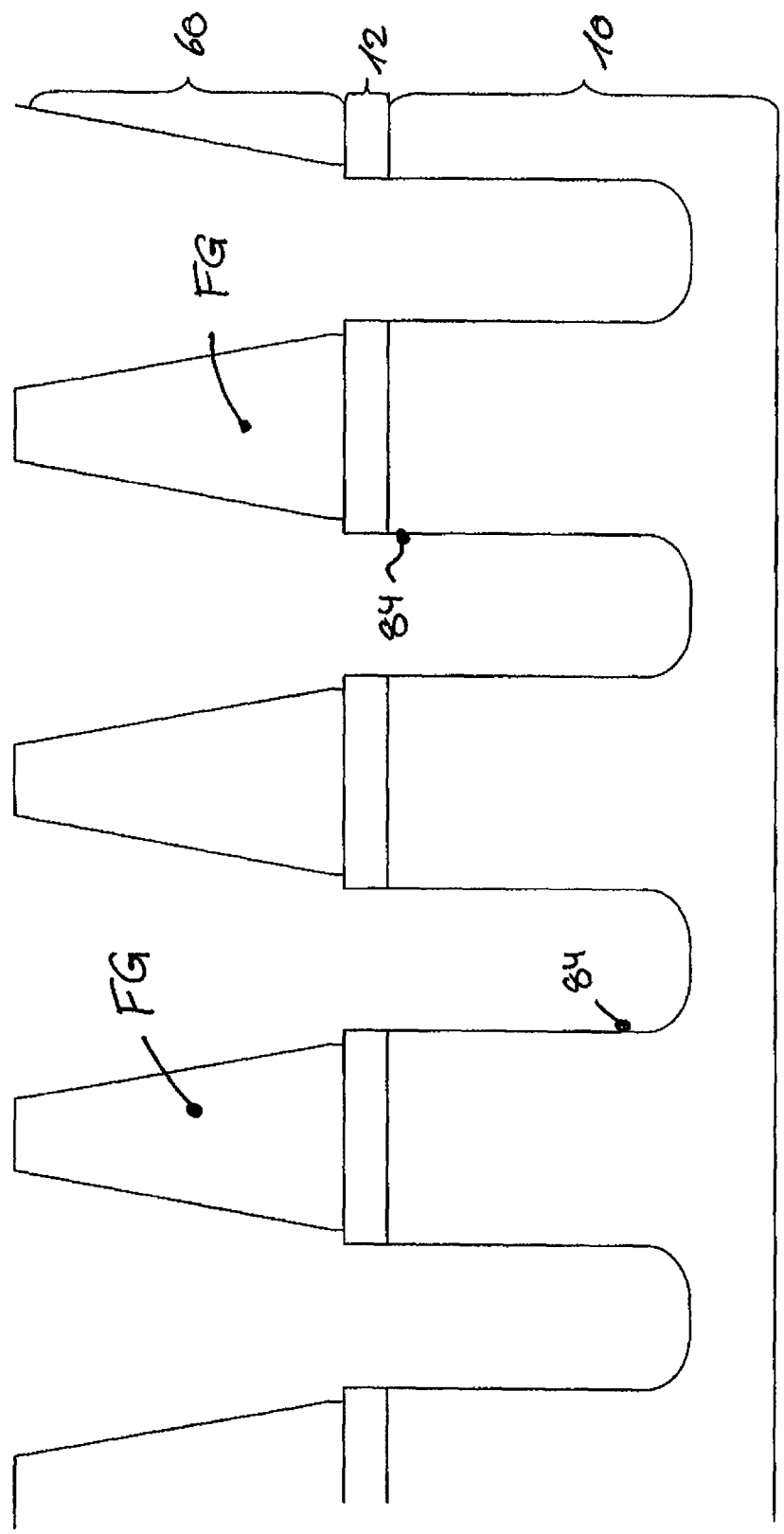

In case that it is necessary to remove the damaged material of the semiconductor structure, another thermal oxidation step may be carried out. Then, at least one etching step is performed to remove the oxide and the nitride from the semiconductor substrate. The result of this at least one etching step is shown in FIG. 8F.

The method of producing an integrated circuit is then continued as explained above with the FCW-method.

What is claimed is:

1. An integrated circuit comprising:
a semiconductor substrate;
an insulation layer on the semiconductor substrate;
a multitude of trenches formed through the insulation layer and into the semiconductor substrate
a multitude of floating-gate electrodes formed on portions of the insulation layer interposed between adjacent ones of the trenches, wherein at least one of the floating-gate electrodes has a lower width and an upper width, the lower width being larger than the upper width, and wherein the at least one of the floating-gate electrodes comprises a transition metal; and
a conductive layer on the insulation layer, wherein the trenches extend through the conductive layer so that portions of the conductive layer interposed between adjacent ones of the trenches form a lower part of the floating-gate electrodes disposed below an upper part of the floating-gate electrodes, the upper part formed by the transition metal and having a lower width and an upper width, the lower width being larger than the upper width.

2. The integrated circuit of claim 1, wherein the at least one of the floating-gate electrodes comprises at least one of the materials: iridium or ruthenium.

3. The integrated circuit of claim 1, wherein the at least one of the floating-gate electrodes comprises a transition metal oxide.

4. The integrated circuit of claim 3, wherein the at least one of the floating-gate electrodes comprises at least one of the materials: iridium oxide or ruthenium oxide.

5. The integrated circuit of claim 1, wherein the at least one of the floating-gate electrodes comprises at least one of the materials: a transition metal silicide, a transition metal nitride, a transition metal boride, a transition metal aluminide or a transition metal carbide.

6. The integrated circuit of claim 5, wherein the transition metal is at least one of the elements: tungsten, molybdenum, tantalum, titanium, cobalt, zirconium, hafnium or niobium.

7. The integrated circuit of claim 6, wherein the at least one of the floating-gate electrodes comprises at least one of the materials: tungsten silicide, molybdenum silicide, tantalum silicide, titanium silicide, cobalt silicide, zirconium silicide, hafnium silicide or niobium silicide.

8. The integrated circuit of claim 7, wherein the at least one of the floating-gate electrodes comprises at least one of the materials: tungsten nitride, titanium nitride, tantalum nitride, hafnium nitride or zirconium nitride.

9. The integrated circuit of claim 1, wherein the at least one of the floating-gate electrodes comprises a first subunit comprising the transition metal and a second subunit comprising a conductive material.

10. The integrated circuit of claim 1, wherein the at least one of the floating-gate electrodes has an inverse-T shape.

11. The integrated circuit of claim 1, wherein the integrated circuit is a semiconductor memory circuit.

12. The integrated circuit of claim 1, further comprising an interface between the lower part and the upper part of the floating-gate electrodes with the lower part and the upper part being made of different materials.

13. The integrated circuit of claim 12, wherein the lower part of the floating-gate electrodes comprises polysilicon.

14. The integrated circuit of claim 12, wherein the material of the lower part of the floating-gate electrodes has a different etch rate than the material of the upper part of the floating-gate electrodes.

15. The integrated circuit of claim 1, wherein the lower part of the floating-gate electrodes has a column-like shape and the upper part of the floating-gate electrodes has an inverse-T shape.

* * * * *